(12) United States Patent
Bhuwalka et al.

(10) Patent No.: US 8,697,510 B2
(45) Date of Patent: Apr. 15, 2014

(54) TUNNEL FIELD-EFFECT TRANSISTOR WITH NARROW BAND-GAP CHANNEL AND STRONG GATE COUPLING

(71) Applicant: Taiwan Semiconductor Manufacturing Company, Ltd., Hsin-Chu (TW)

(72) Inventors: Krishna Kumar Bhuwalka, Asansol (IN); Ken-Ichi Goto, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/741,086

(22) Filed: Jan. 14, 2013

(65) Prior Publication Data

US 2013/0137236 A1   May 30, 2013

Related U.S. Application Data

(62) Division of application No. 12/880,236, filed on Sep. 13, 2010, now Pat. No. 8,354,695, which is a division of application No. 11/828,211, filed on Jul. 25, 2007, now Pat. No. 7,812,370.

(51) Int. Cl.
*H01L 21/336* (2006.01)
*H01L 21/02* (2006.01)
*H01L 29/66* (2006.01)

(52) U.S. Cl.
USPC ........... 438/197; 438/306; 438/307; 257/288; 257/192; 257/E29.55; 257/E21.409; 257/E29.068

(58) Field of Classification Search
CPC ............. H01L 29/7391; H01L 29/66356; H01L 21/26586; H01L 29/66545; H01L 29/66636

USPC ............ 257/E29.55, 288, 192, E21.409, 257/E29.068; 438/197, 306, 307
See application file for complete search history.

(56) References Cited

U.S. PATENT DOCUMENTS 4,934,204 A   6/1990   Hadden, Sr.
5,323,020 A   6/1994   Mohammad et al.
(Continued)

FOREIGN PATENT DOCUMENTS

CN   1357926 A   7/2002
CN   1591906 A   3/2005
JP   61121370 A   6/1986

OTHER PUBLICATIONS

Appenzeller et al., "Comparing Carbon Nanotube Transistors—The Ideal Choice: A Novel Tunneling Device Design," IEEE Transactions on Electron Devices, vol. 52, No. 12, Dec. 2005, pp. 2568-2576.

(Continued)

*Primary Examiner* — Ha Tran T Nguyen
*Assistant Examiner* — Thai T Vuong
(74) *Attorney, Agent, or Firm* — Slater & Matsil, L.L.P.

(57) ABSTRACT

A semiconductor device and the methods of forming the same are provided. The semiconductor device includes a low energy band-gap layer comprising a semiconductor material; a gate dielectric on the low energy band-gap layer; a gate electrode over the gate dielectric; a first source/drain region adjacent the gate dielectric, wherein the first source/drain region is of a first conductivity type; and a second source/drain region adjacent the gate dielectric. The second source/drain region is of a second conductivity type opposite the first conductivity type. The low energy band-gap layer is located between the first and the second source/drain regions.

20 Claims, 30 Drawing Sheets

(56) References Cited

U.S. PATENT DOCUMENTS

| | | | |
|---|---|---|---|
| 5,420,059 A | 5/1995 | Mohammad et al. | |
| 5,683,934 A | 11/1997 | Candelaria | |
| 5,686,739 A * | 11/1997 | Baba | 257/105 |
| 5,705,827 A | 1/1998 | Baba et al. | |
| 6,110,783 A | 8/2000 | Burr | |
| 6,284,579 B1 | 9/2001 | Wang et al. | |
| 6,353,249 B1 | 3/2002 | Boyd et al. | |
| 6,472,685 B2 | 10/2002 | Takagi | |
| 6,897,472 B2 * | 5/2005 | Mears et al. | 257/28 |
| 7,812,370 B2 | 10/2010 | Bhuwalka et al. | |
| 7,834,345 B2 | 11/2010 | Bhuwalka et al. | |
| 8,354,695 B2 | 1/2013 | Bhuwalka et al. | |
| 2001/0048128 A1 | 12/2001 | Yano et al. | |
| 2003/0042547 A1 | 3/2003 | Deleonibus | |
| 2003/0057416 A1* | 3/2003 | Currie et al. | 257/19 |
| 2004/0262596 A1 | 12/2004 | Mears et al. | |
| 2005/0017275 A1* | 1/2005 | Chau et al. | 257/289 |
| 2005/0093033 A1 | 5/2005 | Kinoshita et al. | |
| 2006/0035425 A1* | 2/2006 | Carter et al. | 438/199 |
| 2006/0091490 A1 | 5/2006 | Chen et al. | |
| 2006/0258072 A1* | 11/2006 | Kavalieros et al. | 438/197 |
| 2006/0267093 A1* | 11/2006 | Tang et al. | 257/347 |
| 2007/0134562 A1 | 6/2007 | Hosono et al. | |
| 2007/0178650 A1 | 8/2007 | Chen et al. | |
| 2007/0221991 A1* | 9/2007 | Chung et al. | 257/347 |
| 2008/0050881 A1 | 2/2008 | Chen et al. | |
| 2008/0067607 A1 | 3/2008 | Verhulst et al. | |
| 2009/0026553 A1 | 1/2009 | Bhuwalka et al. | |
| 2010/0059737 A1 | 3/2010 | Bhuwalka et al. | |
| 2010/0123203 A1 | 5/2010 | Bhuwalka et al. | |
| 2010/0327321 A1 | 12/2010 | Bhuwalka et al. | |
| 2011/0027959 A1 | 2/2011 | Bhuwalka et al. | |

OTHER PUBLICATIONS

Aydin et al., "Lateral Interband Tunneling Transistor in Silicon-on-Insulator," Applied Physics Letters, American Institute of Physics, vol. 84, No. 10, Mar. 8, 2004, pp. 1780-1782.

Baba, "Proposal for Surface Tunnel Transistors," Japanese Journal of Applied Physics, The Japan Society of Applied Physics, vol. 31, Part 2, No. 4B, Apr. 15, 1992, pp. L455-L457.

Bhuwalka et al., "P-Channel Tunnel Field-Effect Transistors down to Sub-50 nm Channel Lengths," Japanese Journal of Applied Physics, The Japan Society of Applied Physics, vol. 45, No. 4B, 2006, pp. 3106-3109.

Bhuwalka et al., "Performance Enhancement of Vertical Tunnel Field-Effect Transistor with SiGe in the delta-p+ Layer," Japanese Journal of Applied Physics, The Japan Society of Applied Physics, vol. 43, No. 7A, 2004, pp. 4073-4078.

Bhuwalka et al., "Vertical Tunnel Field-Effect Transistor," IEEE Transactions on Electron Devices, vol. 51, No. 2, Feb. 2004, pp. 279-282.

Bhuwalka, "Novel Tunneling Devices for Future CMOS Technologies," Universitat der Bundeswehr Muchen, 151 pages, 2005.

Boucart et al., "Double-Gate Tunnel FET with High-κ Gate Dielectric," IEEE Transactions on Electron Devices, vol. 54, No. 7, Jul. 2007, pp. 1725-1733.

Gopalakrishnan et al., "I-MOS: A Novel Semiconductor Device with a Subthreshold Slope Lower than kT/q," IEEE International Electron Devices Meeting, 2002, pp. 289-292.

Koga et al., "Three-Terminal Silicon Surface Junction Tunneling Device for Room Temperature Operation," IEEE Electron Device Letters, vol. 20, No. 10, Oct. 1999, pp. 529-531.

Mears et al., "Silicon Superlattice on SOI for High Mobility and Reduced Leakage," IEEE International SOI Conference Proceedings, 2007, pp. 23-24.

Reddick et al., "Silicon Surface Tunnel Transistor," Applied Physics Letters, American Institute of Physics, vol. 67, No. 4, Jul. 24, 1995, pp. 494-496.

Seo et al., "Electronic and Optical Characteristics of Multilayer Nanocrystalline Silicon/Adsorbed Oxygen Superlattice," The Japan Society of Applied Physics, vol. 40, Part 1, No. 8, Aug. 2001, pp. 4799-4801.

Seo et al., "Transport Through a Nine Period Silicon/Oxygen Superlattice," Applied Physics Letters, American Institute of Physics, vol. 79, No. 6, Aug. 6, 2001, pp. 788-790.

Tateshita et al., "High-Performance and Low-Power CMOS Device Technologies Featuring Metal/High-κ Gate Stacks with Uniaxial Strained Silicon Channels on (100) and (110) Substrates," IEEE International Electron Devices Meeting, 2006, 4 pages.

Tsu et al., "Silicon Epitaxy on Si(100) with Adsorbed Oxygen," Electrochemical and Solid-State Letters, The Electrochemical Society, Inc., , vol. 1, No. 2, 1998, pp. 80-82.

* cited by examiner

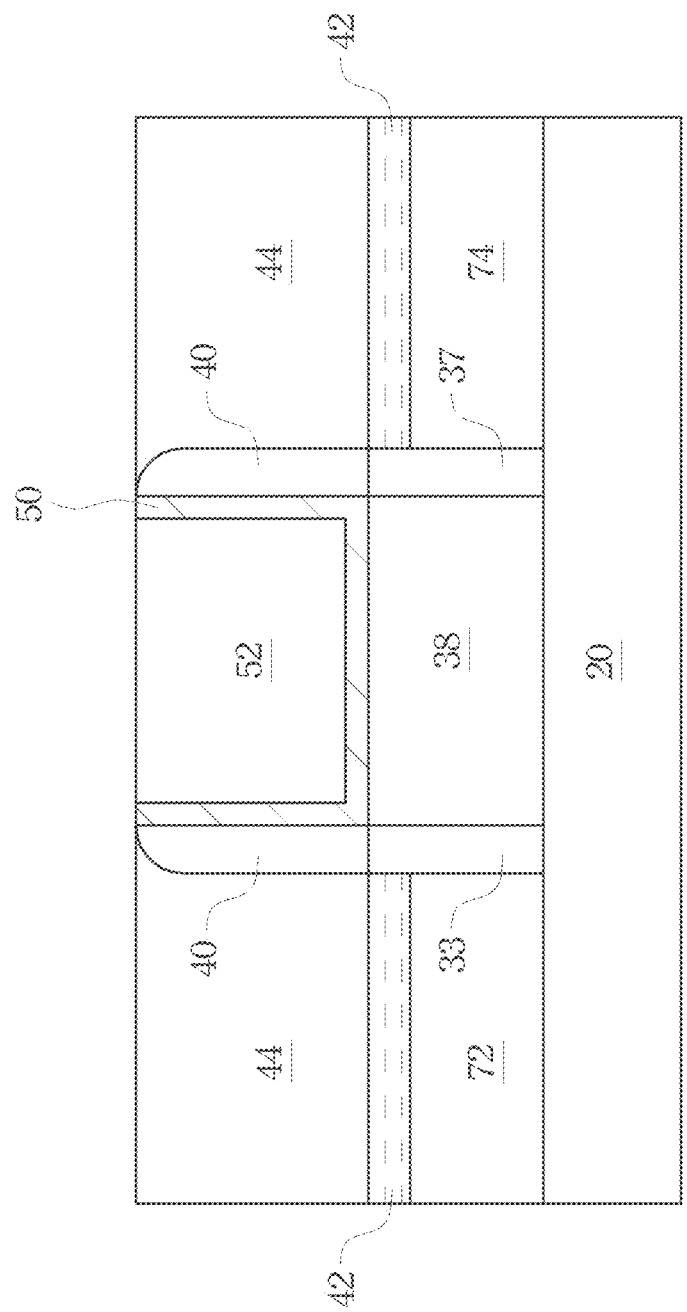

TUNNEL FIELD-EFFECT TRANSISTOR WITH NARROW BAND-GAP CHANNEL AND STRONG GATE COUPLING

This application is a divisional of U.S. patent application Ser. No. 12/880,236, entitled "Tunnel Field-Effect Transistor with Narrow Band-Gap Channel and Strong Gate Coupling," filed on Sep. 13, 2010, which application is a divisional of U.S. patent application Ser. No. 11/828,211, entitled "Tunnel Field-Effect Transistor with Narrow Band-Gap Channel and Strong Gate Coupling," filed on Jul. 25, 2007, which applications are incorporated herein by reference.

TECHNICAL FIELD

This invention relates generally to semiconductor devices, and more specifically to tunnel field-effect transistors formed of gated p-i-n diodes.

BACKGROUND

The metal-oxide-semiconductor (MOS) is a dominating technology for integrated circuits at 90 nm technology and beyond. A MOS device can work in three regions, depending on gate voltage $V_g$ and source-drain voltage $V_{ds}$, linear, saturation, and sub-threshold regions. The sub-threshold region is a region where $V_g$ is smaller than the threshold voltage $V_t$. The sub-threshold swing represents the easiness of switching the transistor current off and thus is an important factor in determining the speed of a MOS device. The sub-threshold swing can be expressed as a function of m*kT/q, where m is a parameter related to capacitance. The sub-threshold swing of a typical MOS device has a limit of about 60 mV/decade (kT/q) at room temperature, which in turn sets a limit for further scaling of operation voltage VDD and threshold voltage $V_t$. This limitation is due to the drift-diffusion transport mechanism of carriers. For this reason, existing MOS devices typically cannot switch faster than 60 mV/decade at room temperatures. The 60 mV/decade sub-threshold swing limit also applies to FinFET or ultra thin-body MOSFET on silicon-on-insulator (SOI) devices. However, even with better gate control over the channel, an ultra thin body MOSFET on SOI or FinFET can only achieve close to, but not below, the limit of 60 mV/decade. With such a limit, faster switching at low operation voltages for future nanometer devices cannot be achieved.

To solve the above-discussed problem, tunnel field-effect transistors (FET) have been explored. FIG. 1 illustrates a FET device formed of a p-i-n diode called the I-MOS (impact-ionization MOS). The I-MOS has a heavily doped p-type (source) region 10 and a heavily doped n-type (drain) region 12 separated by an intrinsic channel region 14. Gate 16 is formed over the intrinsic channel region 14 to control the intrinsic channel region 14. The I-MOS has an offset region 18 between source region 10 and edge 11 of gate 16. When the intrinsic channel region 14 is inverted by the gate bias applied to gate 16, the drain-source voltage drops mainly across the offset region 18 and triggers an avalanche breakdown. The "avalanche multiplication" during breakdown serves as an internal positive feedback, so that the sub-threshold swing can be at a value less than 10 mV/decade at a very low drain voltage (for example, 0.2V). Such an I-MOS offers a promising approach for future MOS technology at 45 nm node and below due to the low power usage, high switching speed, and high on-current to off-current ratio.

The I-MOS shown in FIG. 1 suffers from some drawbacks, however. The output characteristics have large drain-to-source voltage dependence. Further, although it is capable of ultra-fast switching by avalanche mechanism, the critical width of the offset region 18 is sensitive to alignment errors between the gate and the source/drain. This leads to large variations of electrical fields in the offset region 18 during switching, which in turn leads to large variations of the sub-threshold swing. Furthermore, the avalanche mechanism of the I-MOS device is temperature sensitive, and temperature variations also lead to variations in sub-threshold swing.

FIG. 2 illustrates an asymmetric tunnel FET device formed of gated p-i-n diode, which includes a heavily doped drain region 102 and a heavily doped source region 104 separated by channel region 103. Drain region 102 comprises silicon, while source region 104 comprises silicon germanium. The channel region 103 is formed of intrinsic silicon. Gate 108 controls channel region 103. The tunnel FET device shown in FIG. 2 has a kT/q independent sub-threshold swing and a low off-state current. However, such a structure can only improve the on-currents of n-channel tunnel FET devices, while the on-currents of p-channel tunnel FET devices are not improved.

What is needed in the art, therefore, is a tunnel FET structure providing a high on current, a low off-current, and a reliable performance for both p-channel and n-channel tunnel FET devices.

SUMMARY OF THE INVENTION

In accordance with one aspect of the present invention, a semiconductor device includes a low energy band-gap layer comprising a semiconductor material; a gate dielectric on the low energy band-gap layer; a gate electrode over the gate dielectric; a first source/drain region adjacent the gate dielectric, wherein the first source/drain region is of a first conductivity type; and a second source/drain region adjacent the gate dielectric. The second source/drain region is of a second conductivity type opposite the first conductivity type. The low energy band-gap layer is located between the first and the second source/drain regions.

In accordance with another aspect of the present invention, a semiconductor device includes a semiconductor substrate; a low energy band-gap region over the semiconductor substrate; a gate dielectric on the low energy band-gap region; a gate electrode over the gate dielectric; a pair of spacers on opposite sidewalls of the gate electrode; and a first and a second source/drain region on opposing sides of the low energy band-gap region. The first and the second source/drain regions have a higher energy band-gap than the low energy band-gap region, and are of opposite conductivity types. The semiconductor device further includes a first self-aligned offset region between and adjoining the low energy band-gap region and the first source/drain region, wherein the first self-aligned offset region is of a same conductivity type as the first source/drain region; and a second self-aligned offset region between and adjoining the low energy band-gap region and the second source/drain region. The second self-aligned offset region is of a same conductivity type as the second source/drain region. The first and the second self-aligned offset regions include a same material as the low energy band-gap region.

In accordance with yet another aspect of the present invention, a semiconductor device includes a semiconductor substrate; a low energy band-gap region over the semiconductor substrate; a gate dielectric on the low energy band-gap region; a gate electrode over the gate dielectric; a pair of spacers on opposing sidewalls of the gate electrode; and a first and a second source/drain region on opposing sides of the low energy band-gap region. The first and the second source/drain regions have a higher band-gap than the low energy band-gap region, and are of opposite conductivity types. The semiconductor device further includes a first source/drain extension region between and adjoining the low energy band-gap region and the first source/drain region, wherein the first source/drain extension region is of a same conductivity type as the first source/drain region; and a second source/drain extension region between and adjoining the low energy band-gap region and the second source/drain region. The second source/drain extension region is of a same conductivity type as the second source/drain region. The first and the second source/drain extension regions are at least moderately doped.

In accordance with yet another aspect of the present invention, a method for forming a semiconductor device includes providing a low energy band-gap layer; forming a gate dielectric on the low energy band-gap layer; forming a gate electrode over the gate dielectric; forming a first source/drain region adjacent the gate dielectric, wherein the first source/drain region is of a first conductive type; and forming a second source/drain region adjacent the gate dielectric and on an opposing side of the gate electrode than the first source/drain region, wherein the second source/drain region is of a second conductivity type opposite the first conductivity type.

In accordance with yet another aspect of the present invention, a method for forming a semiconductor device includes providing a semiconductor substrate; forming a low energy band-gap layer over the semiconductor substrate; forming a dummy gate stack over the low energy band-gap layer; implanting portions of the low energy band-gap layer unmasked by the dummy gate stack, wherein portions of the low energy band-gap layer on opposite sides of the dummy gate stack are at least moderately implanted with impurities having opposite conductivity types; forming gate spacers on sidewalls of the dummy gate stack after the step of implanting; using the dummy gate stack and the gate spacer as a mask, recessing the low energy band-gap layer to form recesses; filling the recesses with a semiconductor material having a higher band-gap than the low energy band-gap layer to form a first and a second semiconductor region; implanting the first and the second semiconductor regions with impurities having opposite conductivity types; removing the dummy gate stack; forming a gate dielectric layer and a gate electrode layer in a space left by the dummy gate stack; and performing a chemical mechanical polish, wherein remaining portions of the gate dielectric layer and the gate electrode layer form a gate dielectric and a gate electrode, respectively.

In accordance with yet another aspect of the present invention, a method for forming a semiconductor device includes providing a semiconductor substrate; forming a low energy band-gap layer over the semiconductor substrate; forming a dummy gate stack over the low energy band-gap layer; forming gate spacers on sidewalls of the dummy gate stack; using the dummy gate stack and the gate spacers as a mask, recessing the low energy band-gap layer to form recesses; filling the recesses with a semiconductor material having a higher band-gap than the low energy band-gap layer to form a first and a second semiconductor region; performing a first and a second implantation substantially vertical to implant the first and the second semiconductor regions with impurities having the first and the second conductivity types, respectively; tilt performing a third and a fourth implantation to form a first and a second source/drain extension region adjoining the first and the second semiconductor regions, respectively, wherein the first and the second source/drain extension regions are at least moderately doped and have same conductivity types as the first and the second semiconductor regions, respectively; removing the dummy gate stack; forming a gate dielectric layer and a gate electrode layer in a space left by the dummy gate stack; and performing a chemical mechanical polish, wherein remaining portions of the gate dielectric layer and the gate electrode layer form a gate dielectric and a gate electrode, respectively.

The advantageous features of the present invention include balanced performance of p-channel and n-channel FET devices, reduced leakage current, and improved sub-threshold swing and on-current.

BRIEF DESCRIPTION OF THE DRAWINGS

For a more complete understanding of the present invention, and the advantages thereof, reference is now made to the following descriptions taken in conjunction with the accompanying drawings, in which:

FIGS. 14 through 19A are cross-sectional views of intermediate stages in the manufacturing of a second embodiment of the present invention, wherein offset regions are formed between a channel region and respective source/drain regions;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel tunnel field-effect transistors (FET) formed of gated p-i-n diodes and the methods of forming the same are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 3:
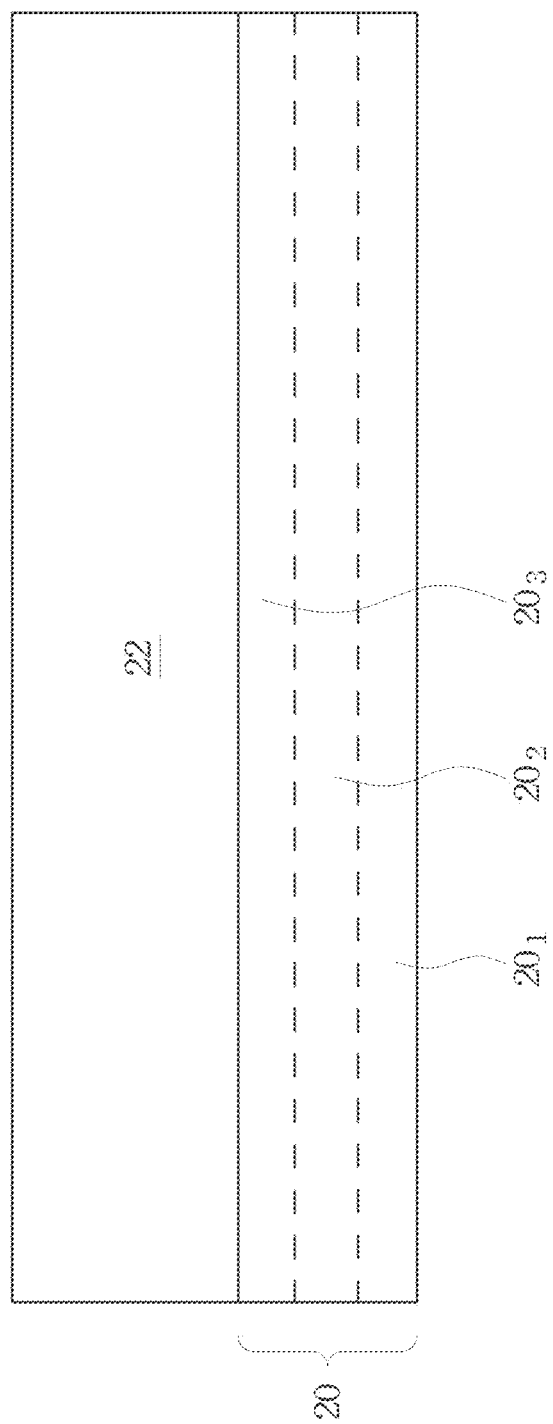
FIGS. 3 through 10 are cross-sectional views of intermediate stages in the manufacturing of a first embodiment of the present invention, wherein source and drain regions are formed by implantations.

A first embodiment of the present invention is provided in FIGS. 3 through 10. Referring to FIG. 3, substrate 20 is provided. In an embodiment, substrate 20 is a bulk substrate comprising a single crystalline semiconductor material, such as silicon, or a compound semiconductor material. In other embodiments, substrate 20 may include more than one semiconductor layer. For example, substrate 20 may have a silicon-on-insulator or silicon-on-carbide structure, including silicon layer $20_3$ on insulator layer $20_2$. Insulator layer $20_2$ may further be located on semiconductor layer $20_1$. In yet other embodiments, substrate 20 includes an insulator.

Low (energy) band-gap layer 22 is formed over substrate 20. Throughout the description, the term "low band-gap" refers to band-gaps lower than the band-gap of silicon (1.12 eV). In the preferred embodiment, low band-gap layer 22 is formed of silicon germanium (SiGe). In other embodiments, other semiconductor materials having low band-gaps, such as Ge, GaAs, InGaAs, InAs, InSb, and combinations thereof, can be used. Due to the possible mismatch in the lattice constants of low band-gap layer 22 and the underlying substrate 20, low band-gap layer 22 may be strained. Alternatively, low band-gap layer 22 forms a bulk substrate, with no underlying substrate 20.

In the embodiment wherein the top layer of substrate 20 includes a crystalline semiconductor material, an epitaxial growth may be performed to grow low band-gap layer 22 on substrate 20. Further, in the case low band-gap layer comprises SiGe, the germanium atomic percentage is preferably less than about 80 percent. It is realized, however, that the optimum germanium percentage is related to the desirable tunnel FET characteristics. For example, if high switching speed is preferred, the germanium percentage is preferably high. However, this may cause the leakage current of the resulting tunnel FET to increase. Conversely, if low power consumption is more preferred over high switching speed, low band-gap layer 22 preferably has a lower germanium percentage.

Low band-gap layer 22 is preferably intrinsic. In an embodiment, low band-gap layer 22 is un-doped. Alternatively, low band-gap layer 22 is lightly doped to a concentration of less than about $1E15/cm^3$.

Figure 4:
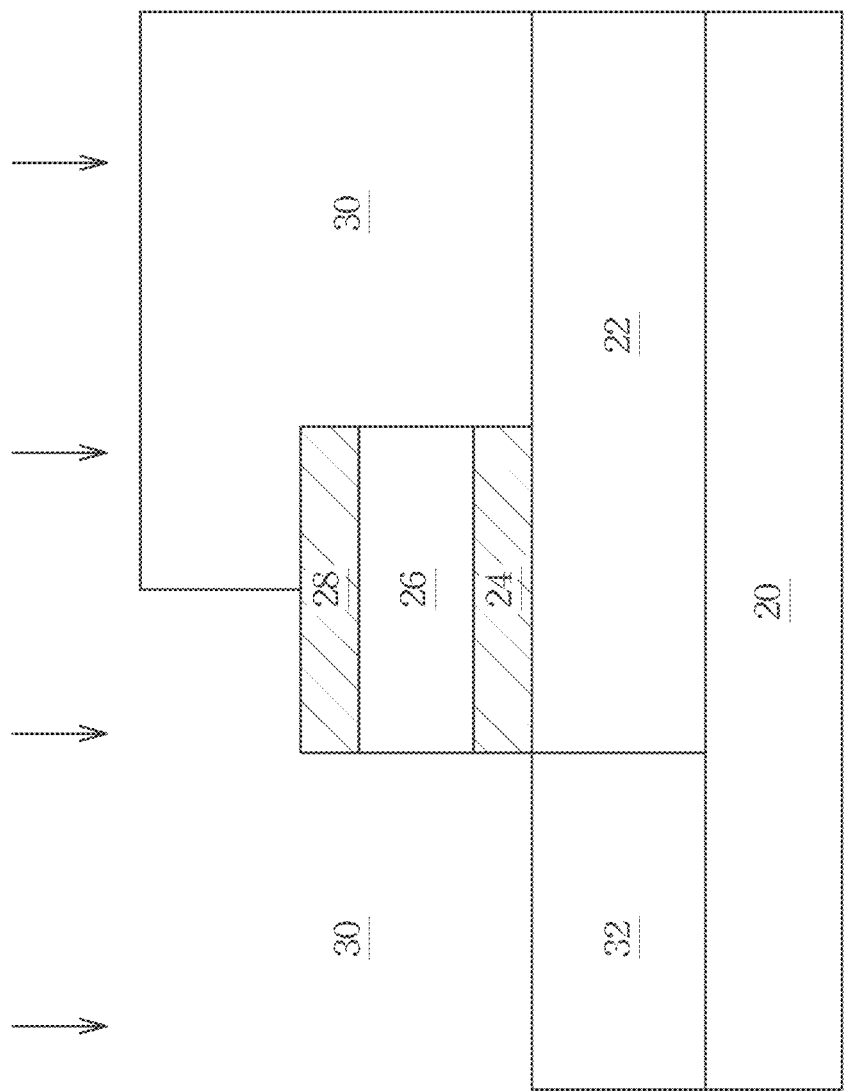

FIG. 4 illustrates the formation of a dummy gate stack, which includes dummy gate dielectric 24, dummy gate electrode 26, and dummy gate mask 28. The dummy gate stack may be formed simultaneously with the formation of gate stacks of other metal-oxide-semiconductor (MOS) devices on the same chip. As is known in the art, the formation of the dummy gate stack includes forming a gate dielectric layer, forming a gate electrode layer on the gate dielectric layer, forming a gate mask layer on the gate electrode, and patterning the stacked layers.

Photo resist 30 is then applied and patterned, followed by an implantation to dope an n-type impurity, which may include phosphorous, arsenic, and combinations thereof. The implantation may be vertically performed, or tilted toward the dummy gate stack. As a result, drain region 32 is formed. Drain region 32 may be substantially aligned to the edge of the dummy gate stack, or extend under the dummy gate stack if the implantation is tilted. Photo resist 30 is then removed.

Figure 5:
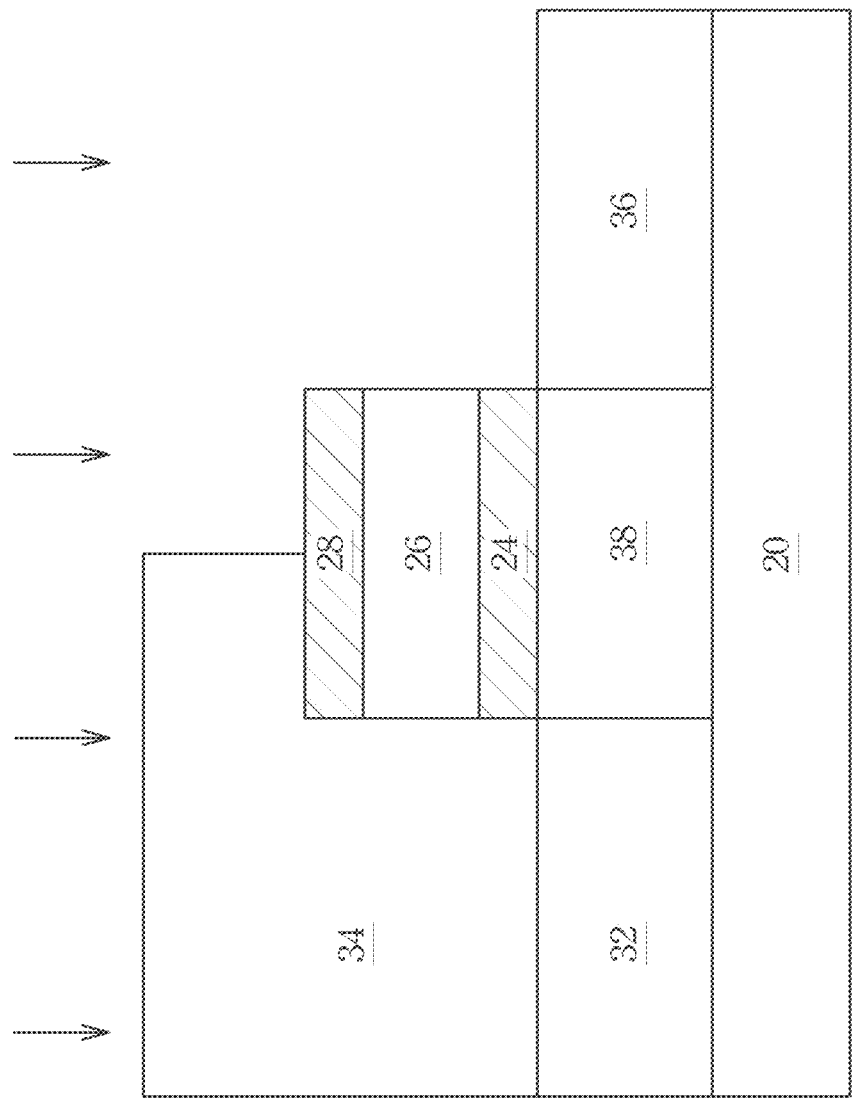

Referring to FIG. 5, photo resist 34 is applied and patterned, covering drain region 32 and a portion of the dummy gate stack. An implantation is then performed to dope a p-type impurity, such as boron, indium, and combinations thereof. Again, the implantation may be vertically performed, or tilted toward the dummy gate stack. As a result, source region 36 is formed. Similarly, source region 36 may be substantially aligned to the edge of the dummy gate stack, or extend under the dummy gate stack if the implantation is tilted. Intrinsic channel region 38 will be formed in an un-implanted region between drain region 32 and source region 36.

In an embodiment, both drain region 32 and source region 36 are heavily doped, and thus drain region 32 is referred to as an n+ region, while source region 36 is referred to as a p+ region. In the described embodiments, "heavily doped" means an impurity concentration of above about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. The resulting tunnel FET device will be an ambipolar FET device, which means that the tunnel FET device can be either an n-channel device or a p-channel device, depending on whether the gate voltage is positive or negative, respectively.

In alternative embodiments, one of the drain region 32 and source region 36 is heavily doped, while the other is moderately doped (referred to as an n region or a p region, depending on the impurity type). The term "moderately doped" may indicate an impurity concentration of lower than "heavily doped," for example, between about $10^{18}/cm^3$ and about $10^{20}/cm^3$. If drain region 32 is an n region, and source region 36 is a p+ region, the resulting tunnel FET will be an n-channel FET, and will be turned on by a positive gate voltage. Conversely, if drain region 32 is an n+ region, and source region 36 is a p region, the resulting tunnel FET will be a p-channel FET, and will be turned on by a negative gate voltage.

Figure 6:
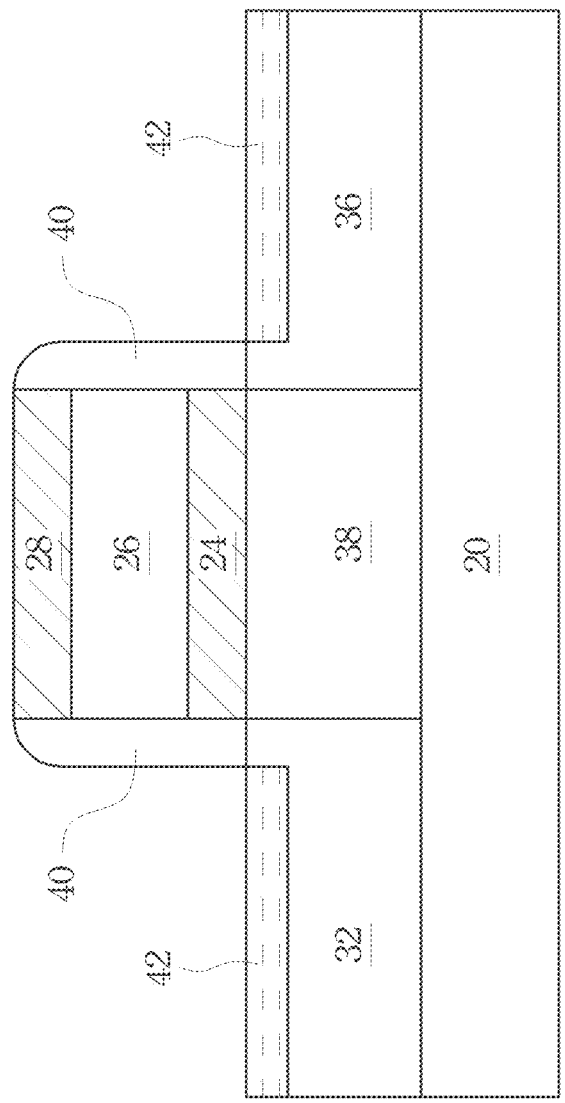

FIG. 6 illustrates the formation of gate spacers 40 and source/drain silicide regions 42. As is known in the art, the formation of gate spacers 40 may include forming a gate dielectric layer, and etching the gate dielectric layer to remove horizontal portions. Source/drain silicide regions 42 may be formed by blanket forming a metal layer, and performing an annealing to cause a reaction between the metal layer and the underlying silicon. The un-reacted metal is then removed.

Figure 7:
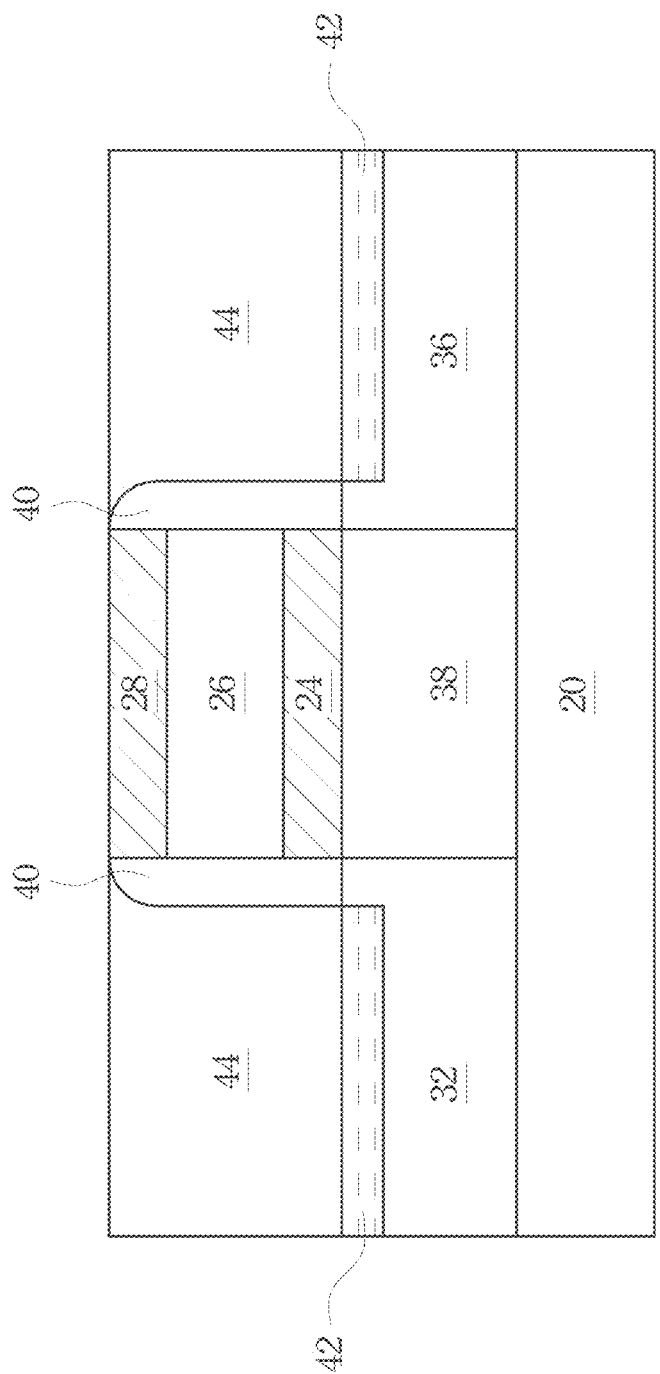

Referring to FIG. 7, a first inter-layer dielectric (ILD) 44 is formed, followed by a chemical mechanical polish (CMP) to level the top surface of ILD 44 to the top surface of dummy gate mask 28. ILD 44 may include commonly used ILD materials, such as boronphosphosilicate glass (BPSG). Other elements such as carbon, nitrogen, oxygen, and combinations thereof, may also be included.

Figure 8:
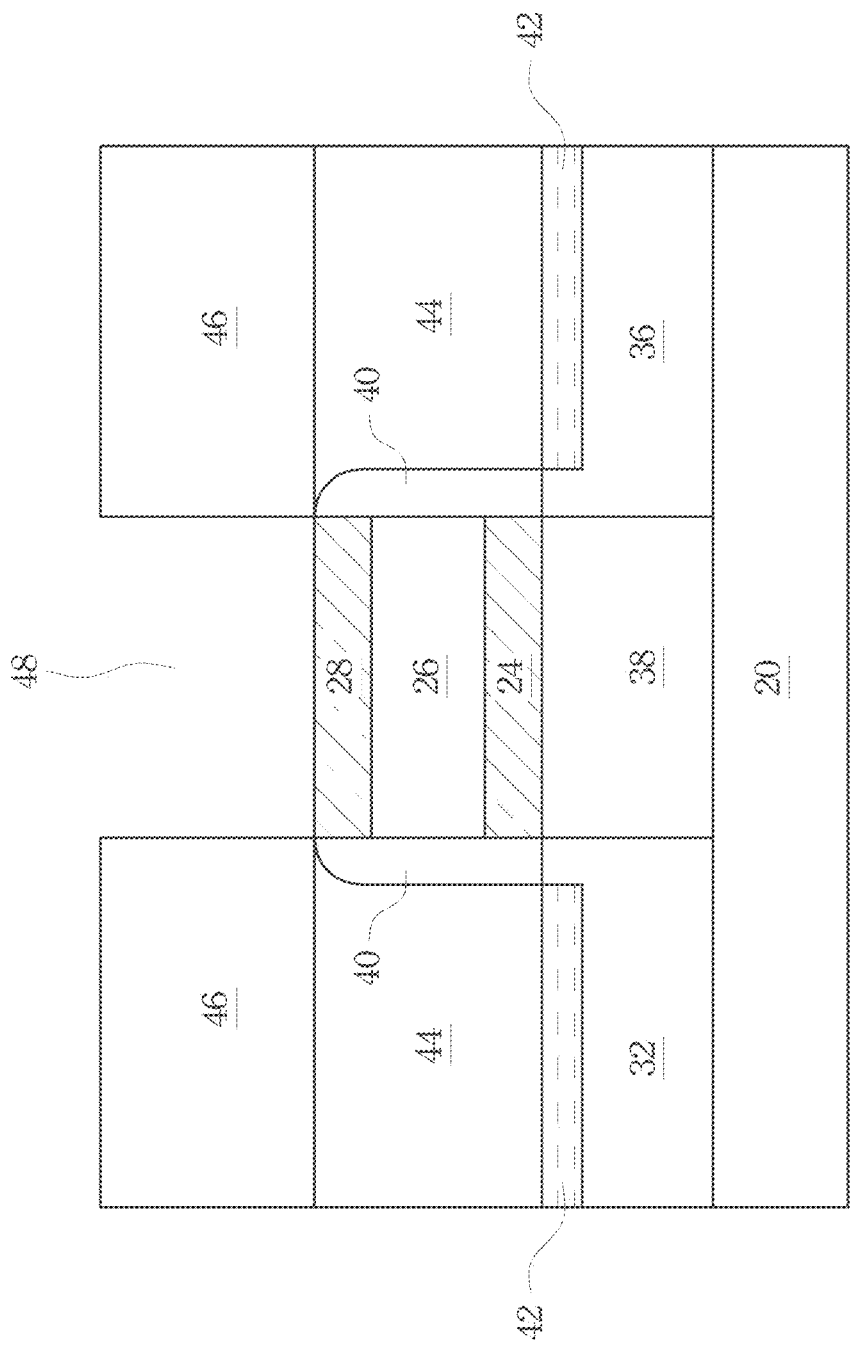
Figure 9:
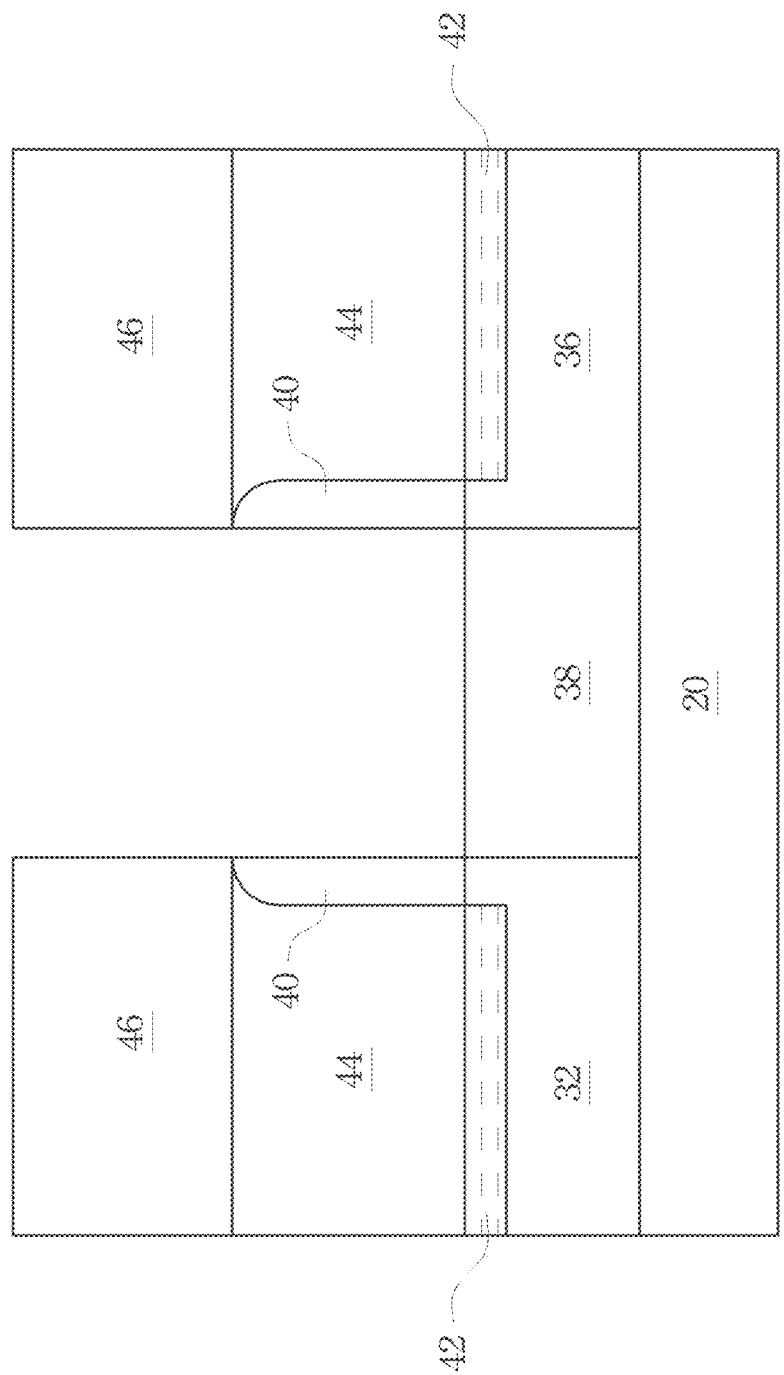

In FIG. 8, photo resist 46 is applied and patterned, forming opening 48, through which dummy gate mask 28 is exposed. Next, as is shown in FIG. 9, the dummy gate stack is removed, preferably by etching, exposing the intrinsic channel region 38.

Figure 10:
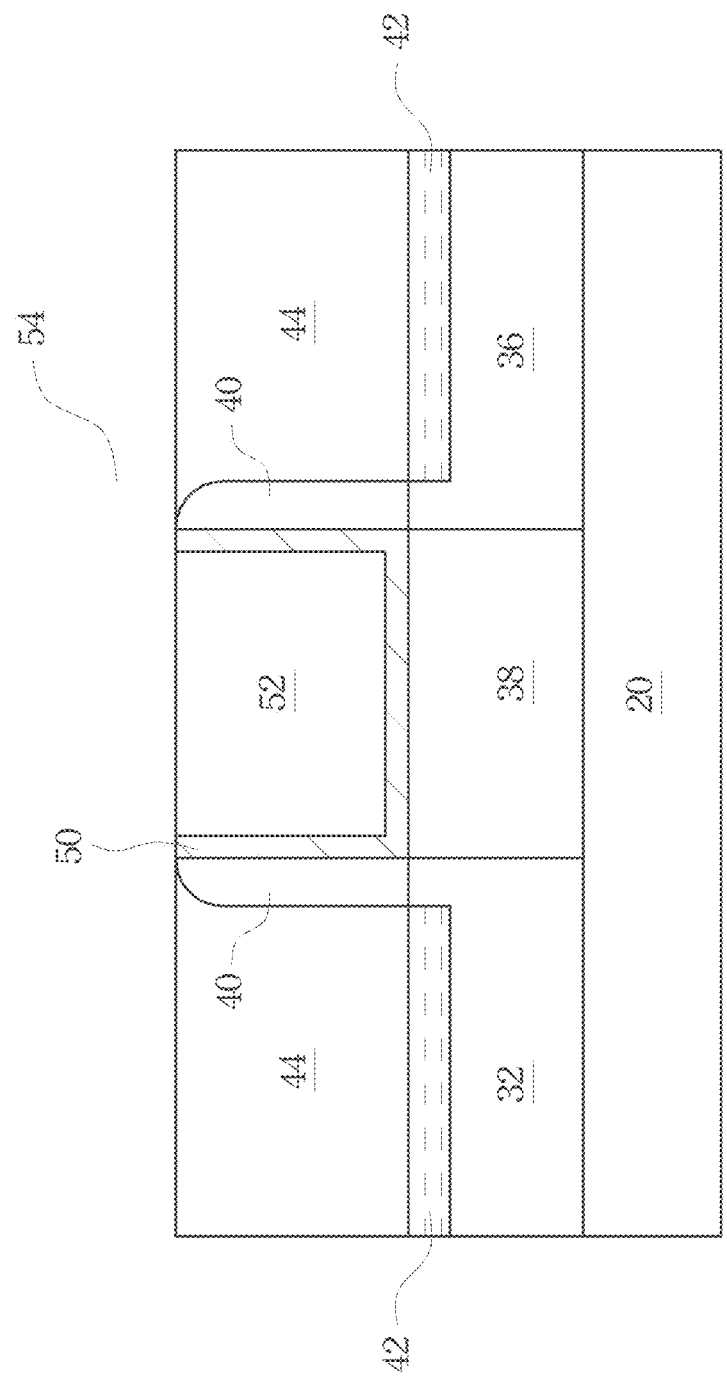

Referring to FIG. 10, gate dielectric 50 and gate electrode 52 are formed. The formation process may include forming a gate dielectric layer, forming a gate electrode layer, and performing a CMP to remove excess materials. In the preferred embodiment, gate dielectric 50 includes a high-k dielectric with a preferred k value between about 7 and about 60. The preferred materials of gate dielectric 50 may include high-k metal oxides such as $HfO_2$, silicon nitride, silicon oxide, silicon oxynitride, and combinations thereof. Gate dielectric 50 may also have a composite structure including more than one layer. Gate electrode 52 may include doped polysilicon, metals, metal silicides, multi-layers thereof, and combinations thereof.

Figure 11A:
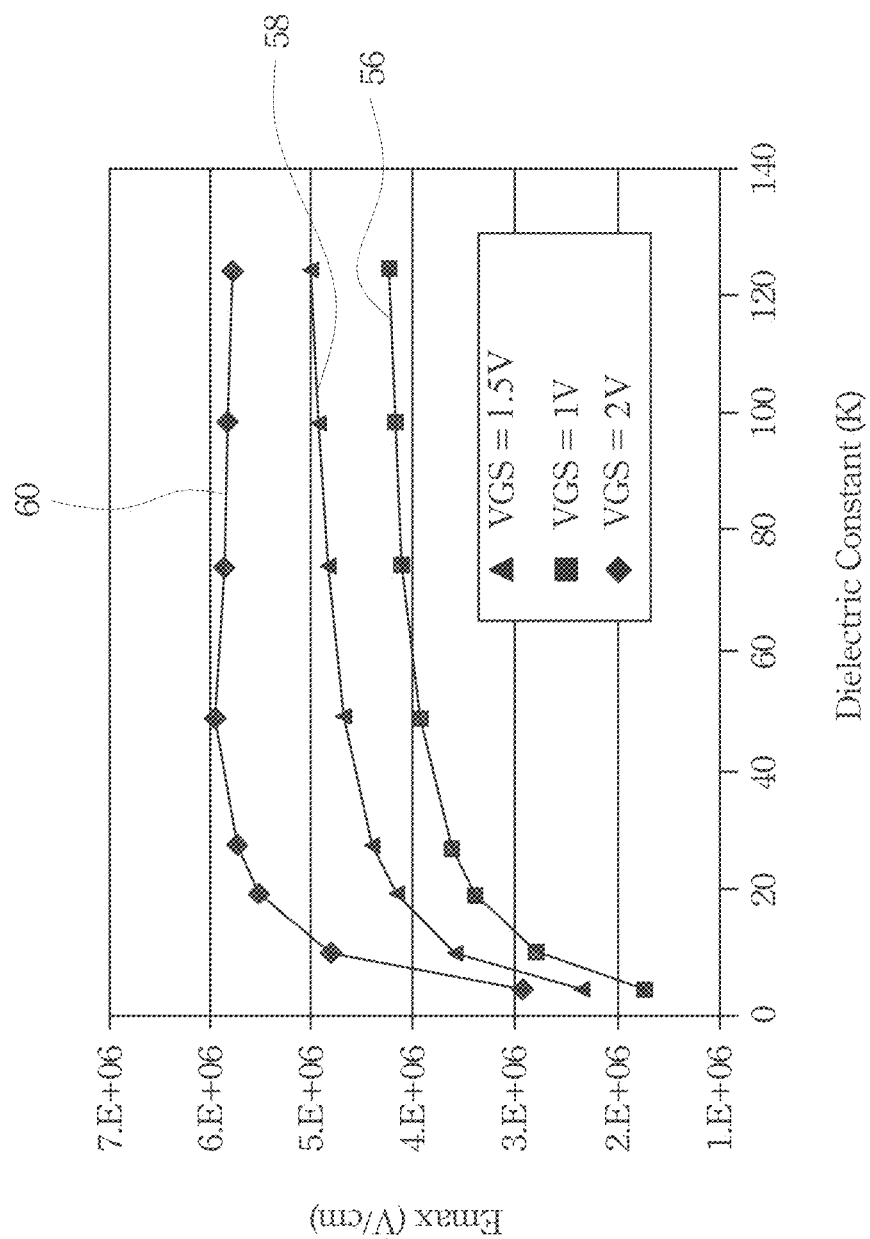
FIG. 11A illustrates maximum electrical fields at tunneling junctions as a function of dielectric constants of gate dielectrics.

The process steps discussed in the preceding paragraphs illustrate the formation of tunnel FET device 54. An advantageous feature of using the high-k gate dielectric materials is the increase in the drive current of tunnel FET device 54. FIG. 11A illustrates a simulation result, which reveals the relationship between the maximum electrical field $E_{max}$ in the tunneling junction and the k value of gate dielectric 50. Lines 56, 58, and 60 are the results of gate-to-source voltage being 1V, 1.5V, and 2V, respectively. It is noted that when the k value increases, the maximum electrical field $E_{max}$ increases accordingly. However, when the k value reaches around 60, the maximum electrical field $E_{max}$ starts to saturate, and may even decrease if the k value further increases. It is expected that with a constant physical thickness of the high-k gate dielectric 50, the current gain is substantially exponential. However, the capacitance only increases linearly. Therefore, the gain in the drive current of the tunnel FET device more than offsets the degradation in the capacitance (and hence RC delay). Accordingly, the high-k dielectric materials are preferred.

Simulation results also revealed that the drive currents of tunnel FETs are related to the germanium percentage in the intrinsic channel region 38. When the germanium percentage increases, the drive current increases accordingly.

Figure 11B:
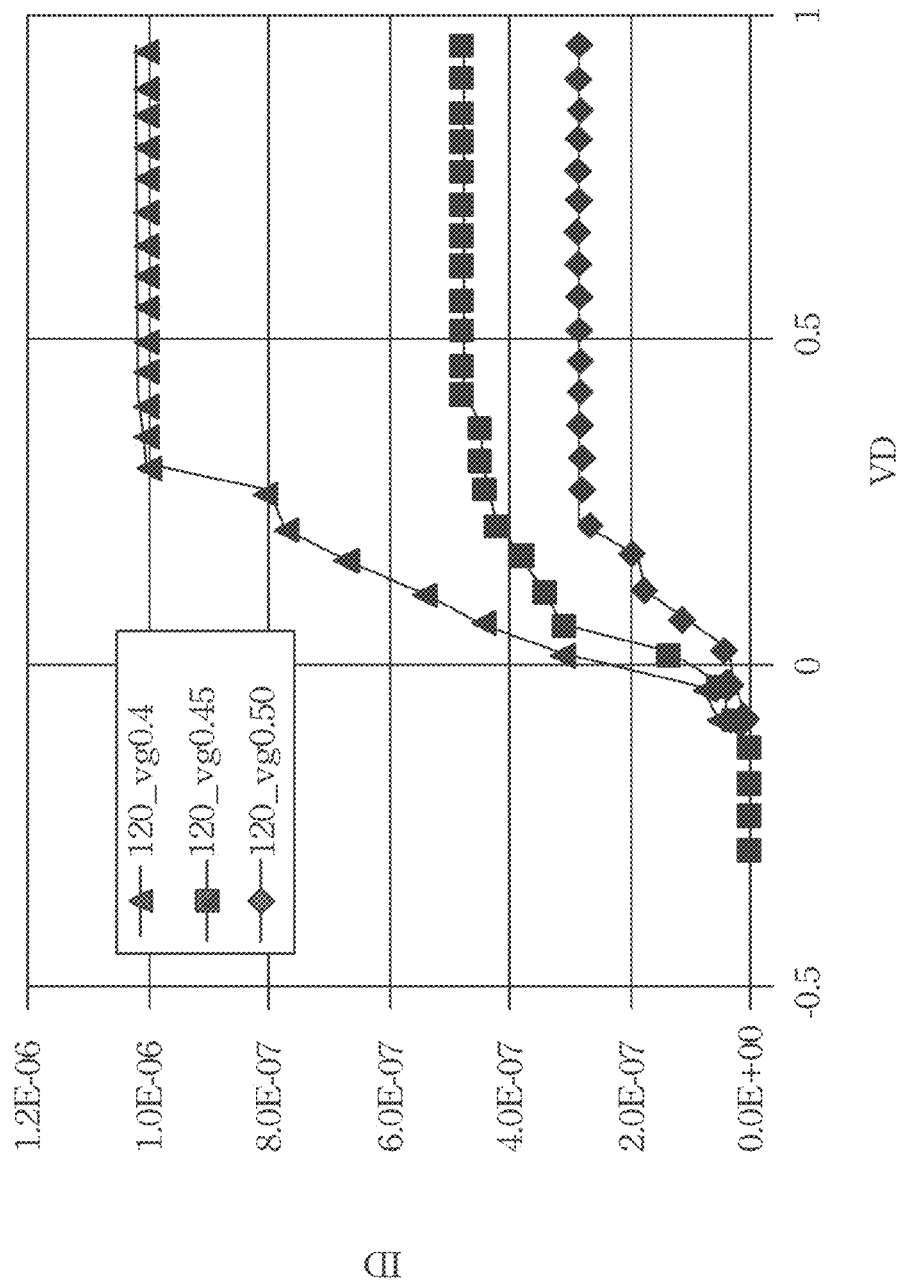
FIG. 11B illustrates an I-V curve of the first embodiment.

FIG. 11B illustrates a simulated I-V characteristic of the embodiment shown in FIG. 10. It is found that the saturation drive currents ID are independent from the drain voltages VD, and is only affected by the gate voltages Vg.

Figure 11C:
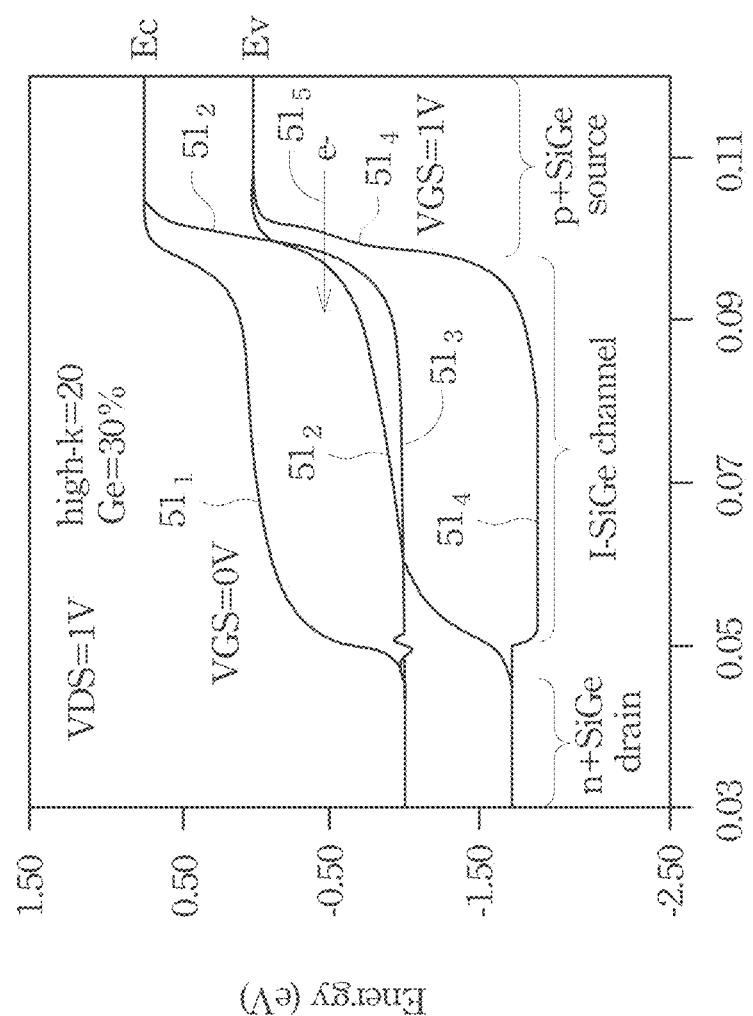
FIG. 11C illustrates a simulated energy band diagram of the first embodiment.

FIG. 11C illustrates a simulated energy band diagram of a symmetrical channel FET device as shown in FIG. 10, wherein the intrinsic channel is formed of SiGe. Lines $51_1$ and $51_2$ are a conduction band and a valence band, respectively, with no gate voltage applied, while lines $51_3$ and $51_4$ are a conduction band and a valence band, respectively with 1 volt gate-to-source voltage applied. It is noted that strong inversion occurs after the gate voltage is applied. The strong inversion causes the narrowing between bands $51_3$ and $51_4$, and hence electrons can easily tunnel through the energy barrier between valence band $51_4$ and conduction band $51_3$ (refer to arrow $51_5$), which barrier is narrowed due to the strong inversion.

Figure 11D:
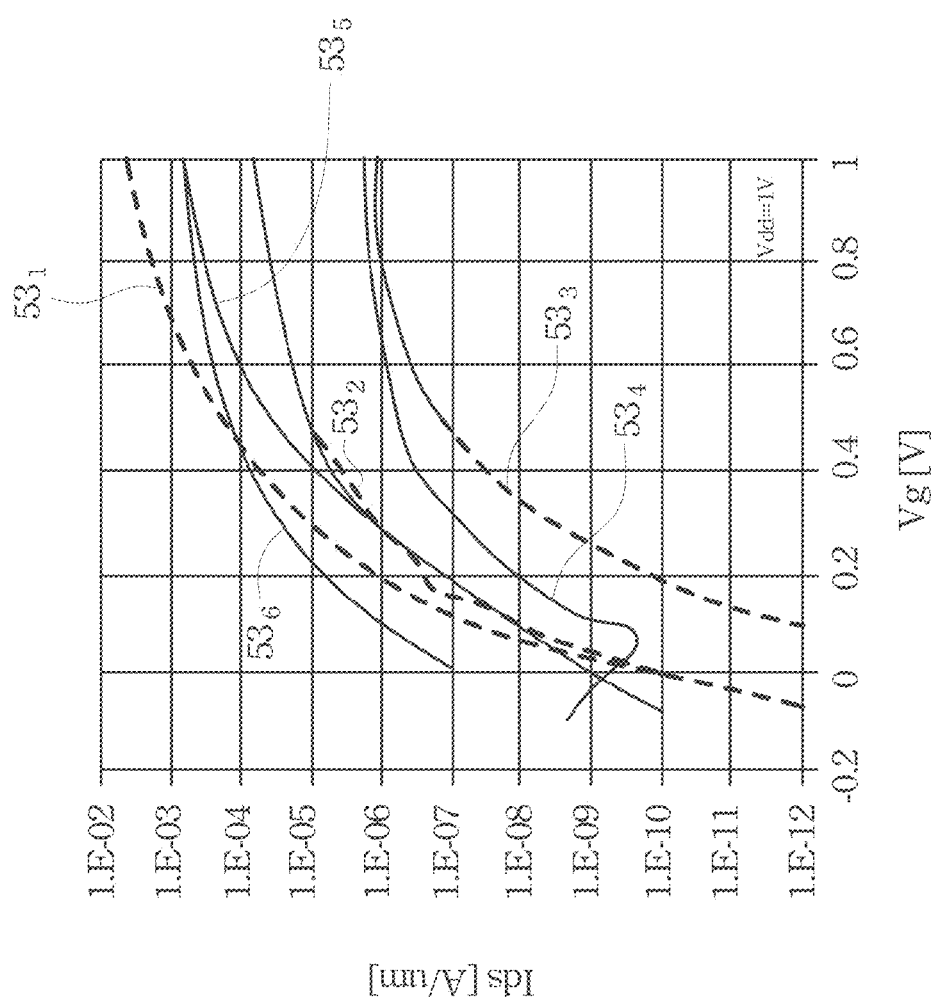
FIG. 11D compares the drive currents of the first embodiment of the present invention with various MOS devices having different structures and channel materials.

FIG. 11D illustrates the drive currents of various devices as a function of gate voltages. Dash line $53_1$ is the simulation result of a SiGe intrinsic tunnel FET device (with 40 percent germanium) having a metal gate and a high-k gate dielectric (k=20). The remaining lines $53_2$ through $53_6$ are results taken from various publications and simulation results. Lines $53_2$, $53_3$, and $53_4$ and are results of tunnel FET devices with silicon channels, while lines $53_5$ and $53_6$ are results of conventional MOS devices. FIG. 11D has shown that at a gate voltage of 1 volt, the embodiment of the present invention (line $53_1$), has a higher drive current than others.

Figure 12:
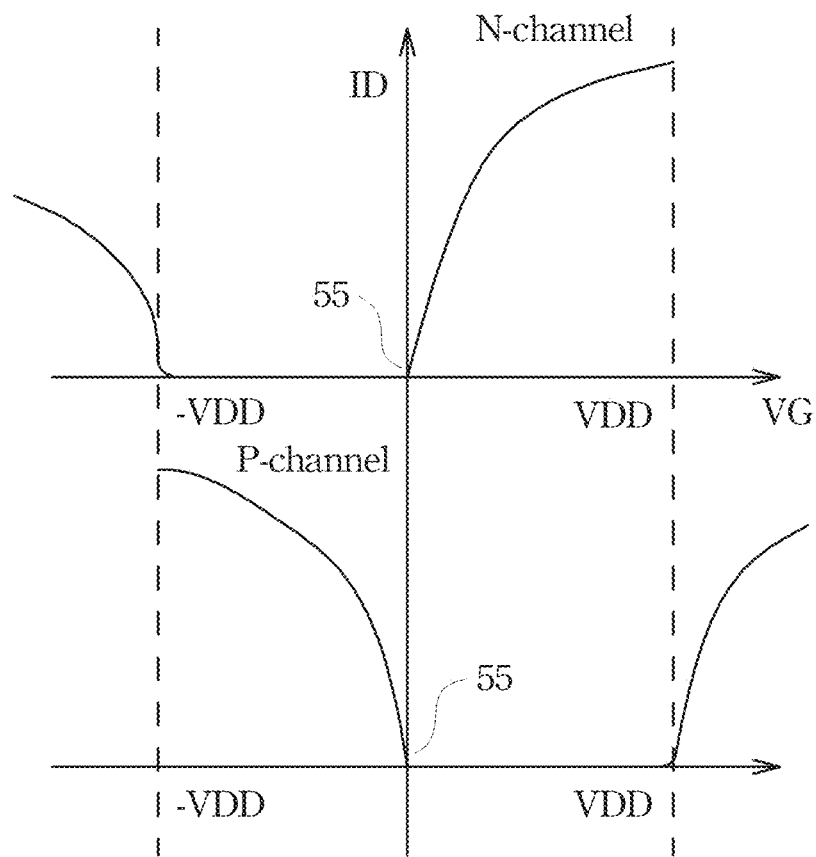
FIG. 12 illustrates expected I-V curves of asymmetric n-channel and p-channel tunnel
FET devices.

FIG. 12 illustrates expected I-V curves of asymmetric p-channel and n-channel tunnel FET devices. Preferably, for n-channel tunnel FET devices, there are no drive currents when negative gate voltages are applied, and drive currents are generated when positive gate voltages are applied. The drive currents increase with the increase in the gate voltages. On the other hand, for p-channel tunnel FET devices, there are no drive currents when positive gate voltages are applied. With negative gate voltages, drive currents are generated, wherein the drive currents increase with the increase in the magnitude of the negative gate voltage. The reverse breakdown voltages of both p-channel and n-channel devices preferably have magnitudes substantially equal to, or even greater than, VDD. By adjusting the work function and the doping concentrations in source and drain regions, the starting points 55 from which the drive currents begin to flow may be adjusted.

Table 1 shows the simulated electrical performance of various tunnel FETs having different channel materials and different gate dielectrics.

TABLE 1

| When Vdd = 1 V | | Tunnel FET | | MOS |
|---|---|---|---|---|
| Substrate (i-Channel) | Si | Si | SiGe | Si |
| Gox | $SiO_2$ | K = 10 | K = 20 | $SiO_2$ |
| EOT (Å) | 20 | 7.8 | 3.9 | 20 |
| Ion (A/μm) | ~1e-6 | ~1e-4 | ~3e-3 | ~1e-3 |
| Ioff (A/μm) | <1e-14 | ~1e-10 | ~1e-10 | ~1e-9 |
| S (mV/dec 300K) | <60 | <60 | <60 | >60 |
| DIBL (mV/V) | <20 | <20 | <20 | >150 |

Table 1 has proven that the performances of tunnel FET devices having intrinsic SiGe channels are overall at least comparable, and likely to be better than conventional MOS devices. Tunnel FET devices with intrinsic SiGe channels have greater drive currents than tunnel FET devices with intrinsic Si channels, although leakage currents of tunnel FET devices with intrinsic SiGe channels are likely to be greater than that of the tunnel FET devices with intrinsic Si channels.

It is appreciated that the work function of gate electrode 52 also affects the device performance, such as the I-V curve of tunnel FET device 54. To achieve the optimum I-V curve, the doping concentrations of drain region 32, source region 36, intrinsic channel region 38, and the work function of gate electrode 52, need to be tuned.

Figure 13:
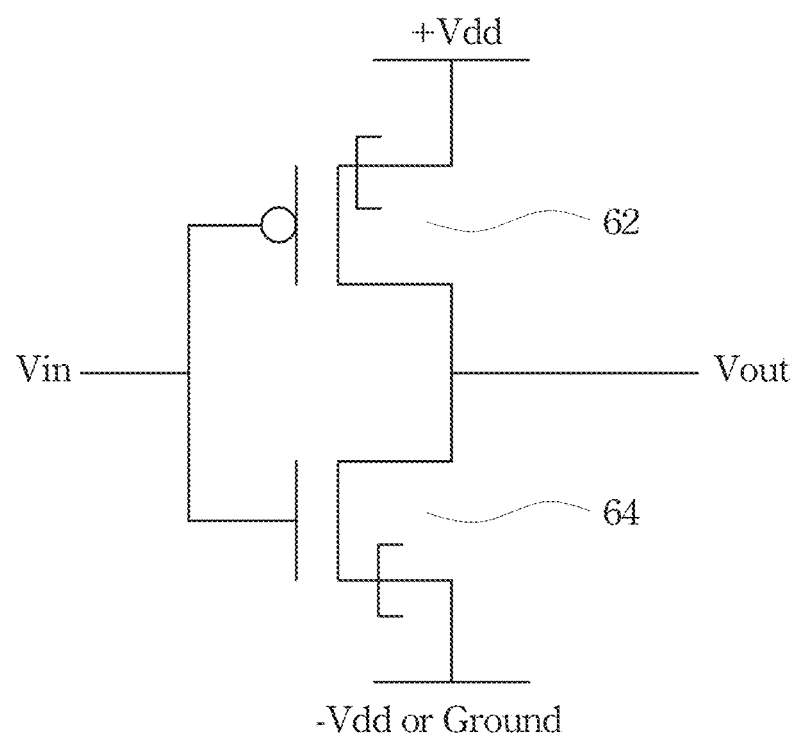
FIG. 13 illustrates an inverter formed of asymmetric tunnel FETs.

As discussed in the preceding paragraphs, an n-channel tunnel FET device and a p-channel tunnel FET device can be formed by heavily doping either one of the drain region 32 or source region 36, respectively, and moderately doping the other source/drain region. FIG. 13 illustrates an inverter formed using the asymmetrically doped tunnel FETs. The inverter includes p-channel tunnel FET device 62 and n-channel tunnel FET device 64. The bracket signs indicate the heavily doped sides of the respective tunnel FET devices. The inverter shown in FIG. 13 works essentially the same as the inverters formed of conventional MOS devices. When a high input voltage Vin is applied, the p-channel tunnel FET device 62 is turned off, while the n-channel tunnel FET device 64 is turned on. Conversely, when a low input voltage Vin is applied, the p-channel tunnel FET device 62 is turned on, while the n-channel tunnel FET device 64 is turned off. The relationships between input voltage Vin and the states of n-channel tunnel and p-channel tunnel FET devices are illustrated in Table 2.

TABLE 2

| Vin | Vout | N-Channel FET | P-Channel FET |
|---|---|---|---|
| High | Low | on | off |
| Low | High | off | on |

Figure 14:
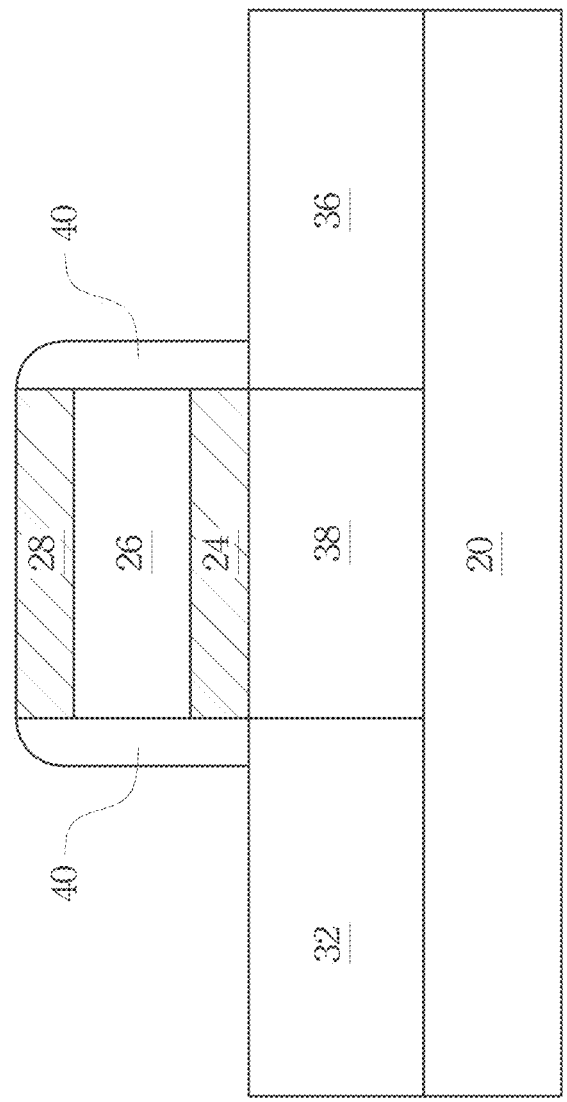
Figure 15:
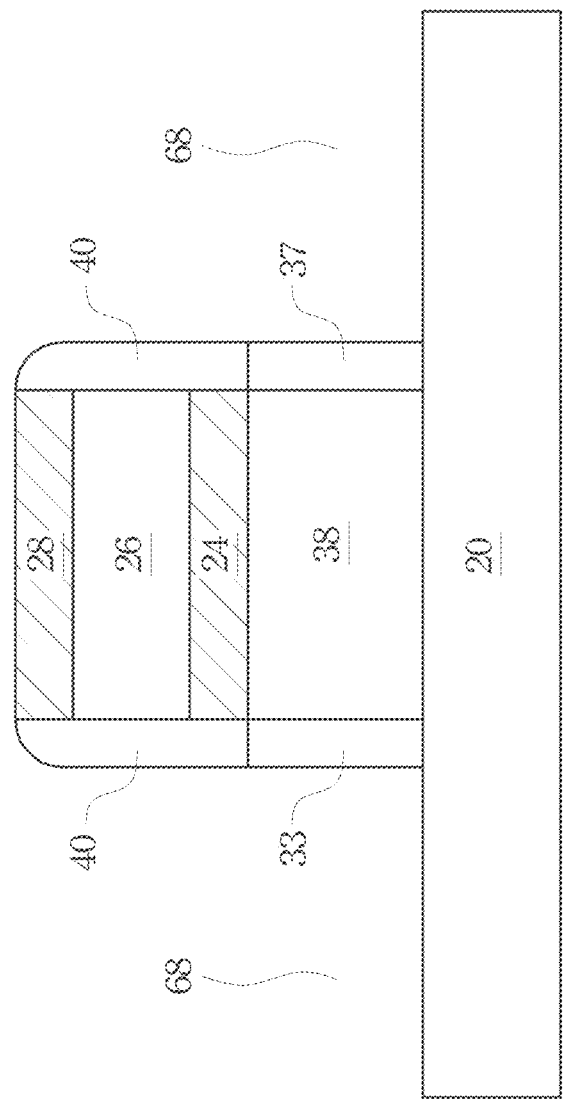

FIGS. 14 through 19 illustrate cross-sectional views in the manufacturing of a second embodiment. The initial steps of this embodiment may be essentially the same as shown in FIGS. 3 through 5, and hence forming drain region 32, source region 36, and channel region 38. Next, as shown in FIG. 14, gate spacers 40 are formed using essentially the same method as discussed in the first embodiment. In FIG. 15, the exposed SiGe regions 32 and 36 are recessed, forming recesses 68, while the portions of SiGe regions 32 and 36 protected by gate spacers 40 are left, forming self-aligned offset regions 33 and 37, respectively. The recessing step may be performed by anisotropically or isotropically etching the exposed SiGe regions 32 and 36 using plasma. Alternatively, the recessing step may include implanting amorphizing species, such as silicon, germanium, argon, and the like, into the exposed portions of the low energy band-gap layer to form amorphized regions, and selectively etching the amorphized regions. SiGe regions 32 and 36 may be recessed until the underlying substrate 20 is exposed. Alternatively, only a top portion of the SiGe regions 32 and 36 are recessed.

Figure 16:
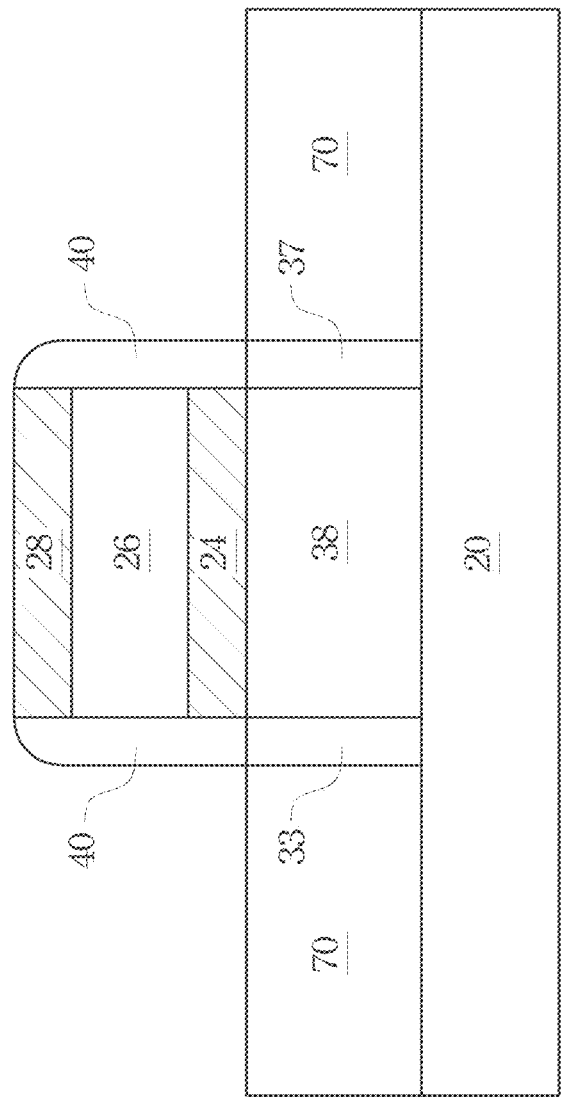

In FIG. 16, silicon is epitaxially grown in recesses 68, forming silicon regions 70. Preferably, selective epitaxial growth (SEG) is performed using a chemical vapor deposition tool, wherein the precursors include silicon-containing gases such as $SiH_4$ (silane).

Figure 17:
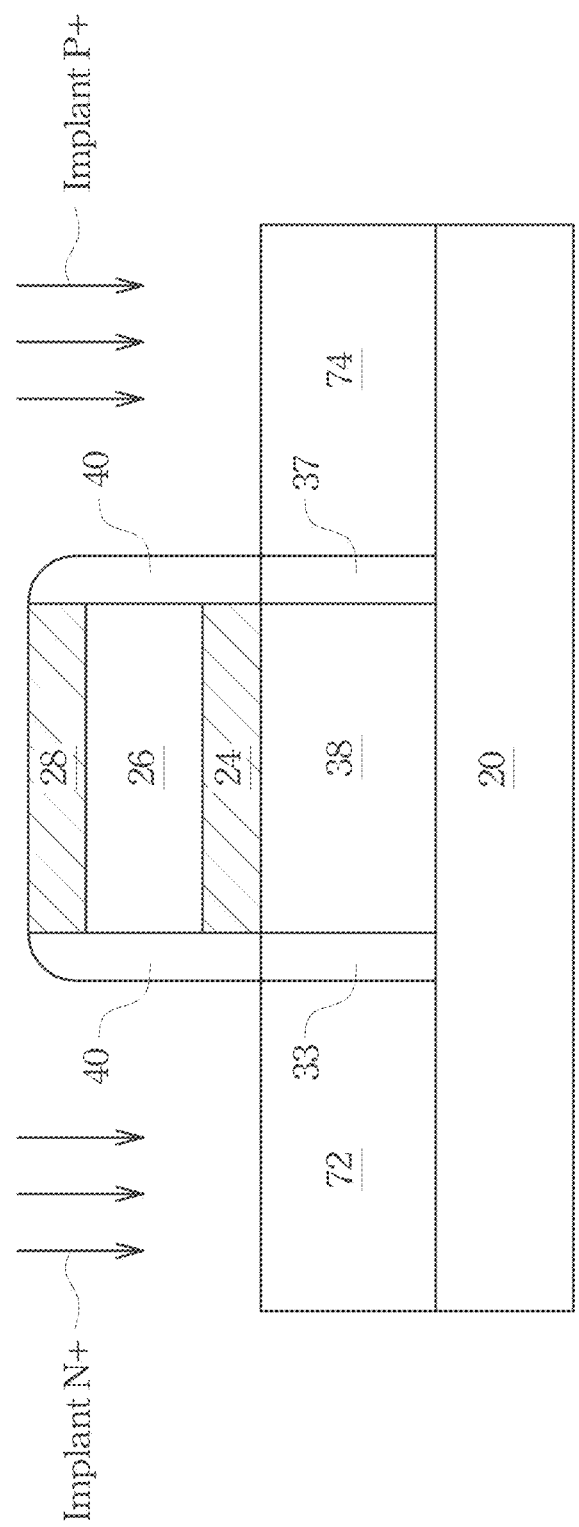

FIG. 17 illustrates the implantation of silicon regions 70. The silicon region 70 adjoining offset region 33 is heavily doped with an n-type impurity, forming n+ region 72, while the silicon region 70 adjoining offset region 37 is heavily doped with a p-type impurity, forming p+ region 74. As one skilled in the art will perceive, the formation of the n+ region 72 and the p+ region 74 involves the formation of photo resists as masks.

Figure 18:
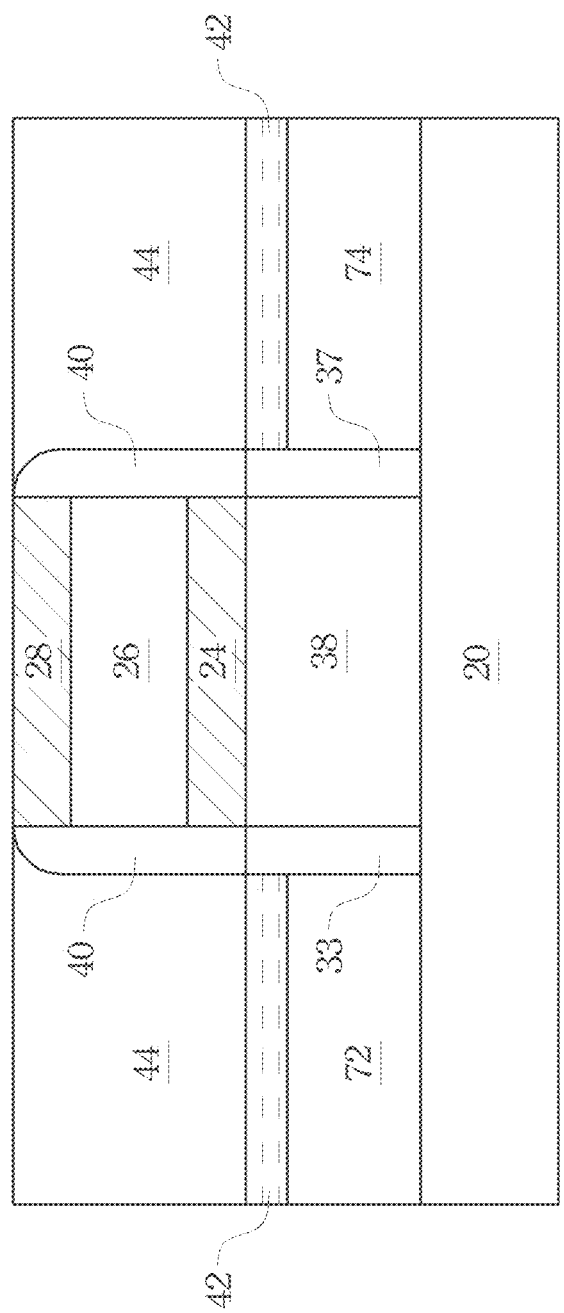

FIG. 18 illustrates the formation of source/drain silicide regions 42 and ILD 44, which may be formed using essentially the same methods and materials as in the first embodiment. Next, dummy gate mask 28, dummy gate electrode 26, and dummy gate dielectric 24 are removed, and gate dielectric 50 and gate electrode 52 are formed. The resulting structure is shown in FIG. 19A. Again, the materials and the formation methods of gate dielectric 50 and gate electrode 52 may be essentially the same as in the first embodiment.

Figure 19B:
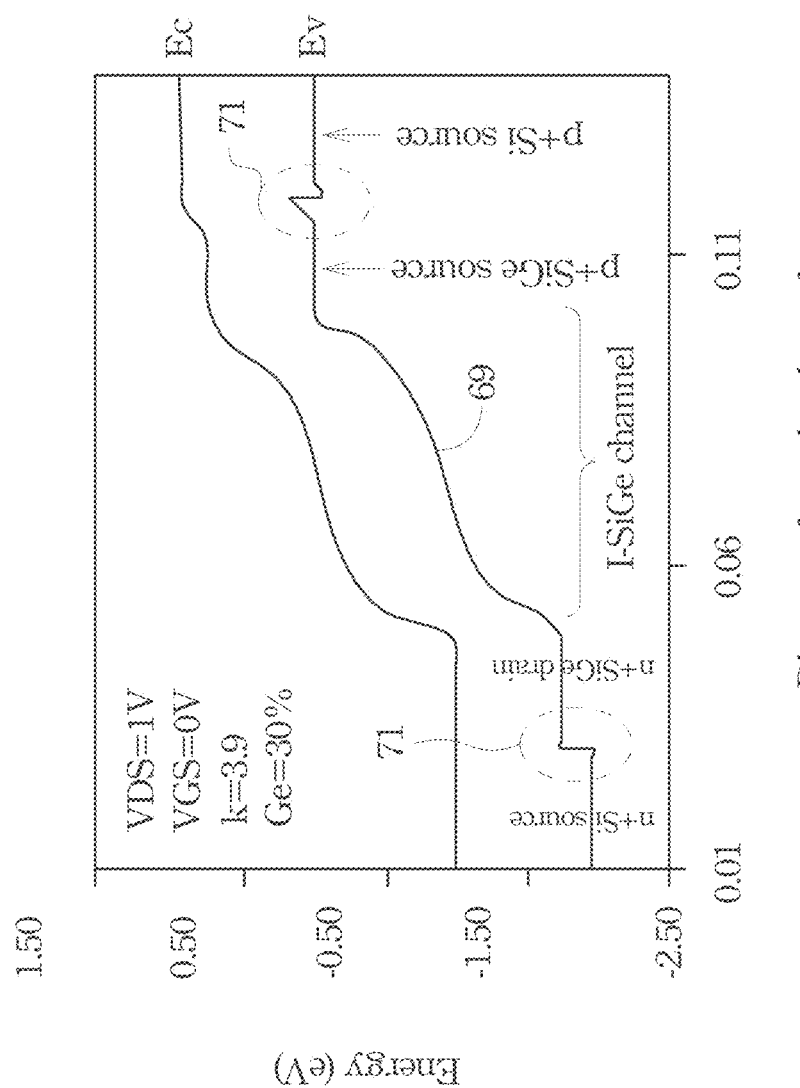
FIG. 19B illustrates a simulated energy band diagram of the second embodiment.

FIG. 19B illustrates a simulated energy band diagram of tunnel FET devices similar to what is shown in FIG. 19A, except the simulated tunnel FET devices have gate-first structures. It is noted that the valence band 69 has heterogeneous structures 71. It is believed that such heterogeneous structures act as barriers for the leakage currents. As a result, the leakage currents of the structure shown in FIG. 19A are significantly reduced.

Similarly, instead of doping both the source side and drain side (each including an offset region 33 or 37 and an adjoining doped region 72 or 74) heavily, either one of the source/drain sides may be heavily doped, while the other side may be moderately doped, forming asymmetric tunnel FETs.

An advantageous feature of this embodiment is that by replacing portions of the source/drain regions with silicon, the self-aligned offset SiGe regions adjoin silicon regions, hence forming a hetero-structure, and the off-state leakage current is reduced. Simulation results have revealed that by using this structure, the leakage current can be reduced by up to two orders. A possible reason may be that the butted silicon regions result in a higher band barrier to retard the leakage currents.

Figure 20:
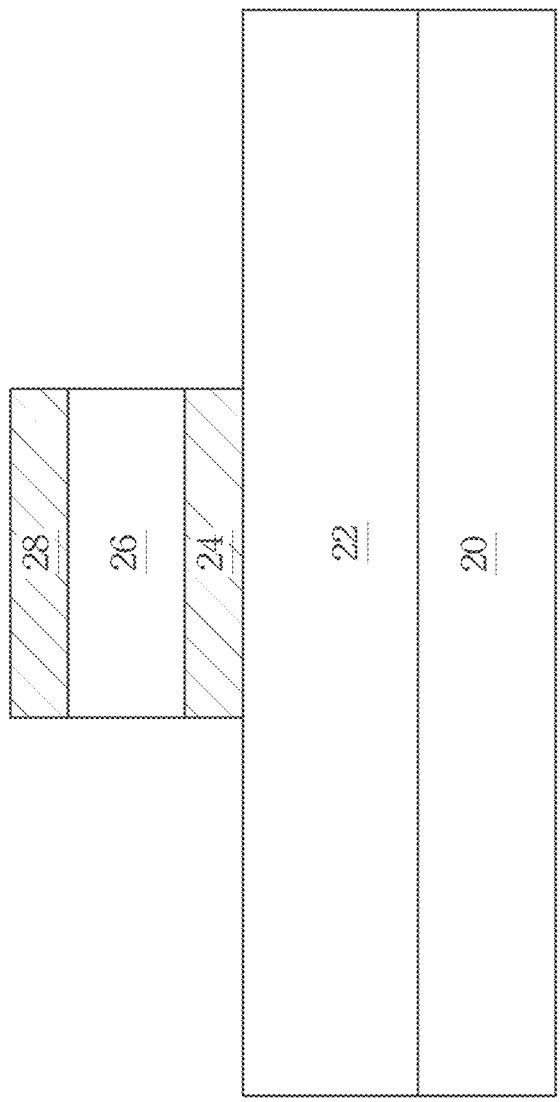
FIGS. 20 through 26 are cross-sectional views of intermediate stages in the manufacturing of a third embodiment of the present invention, wherein at least moderately doped source/drain extension regions are formed between the channel region and source/drain regions.
Figure 21:
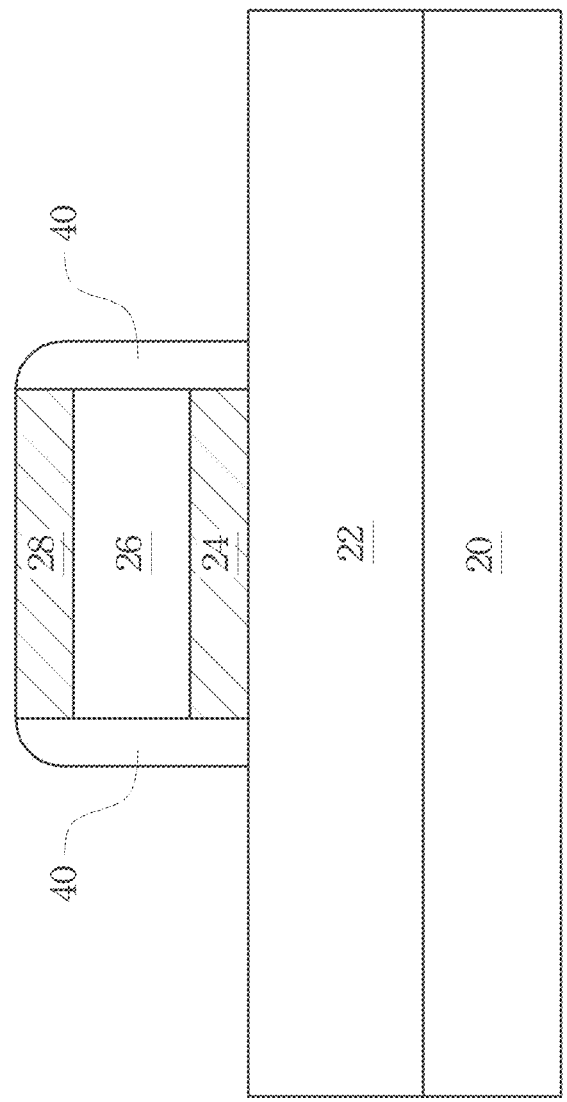
Figure 22:
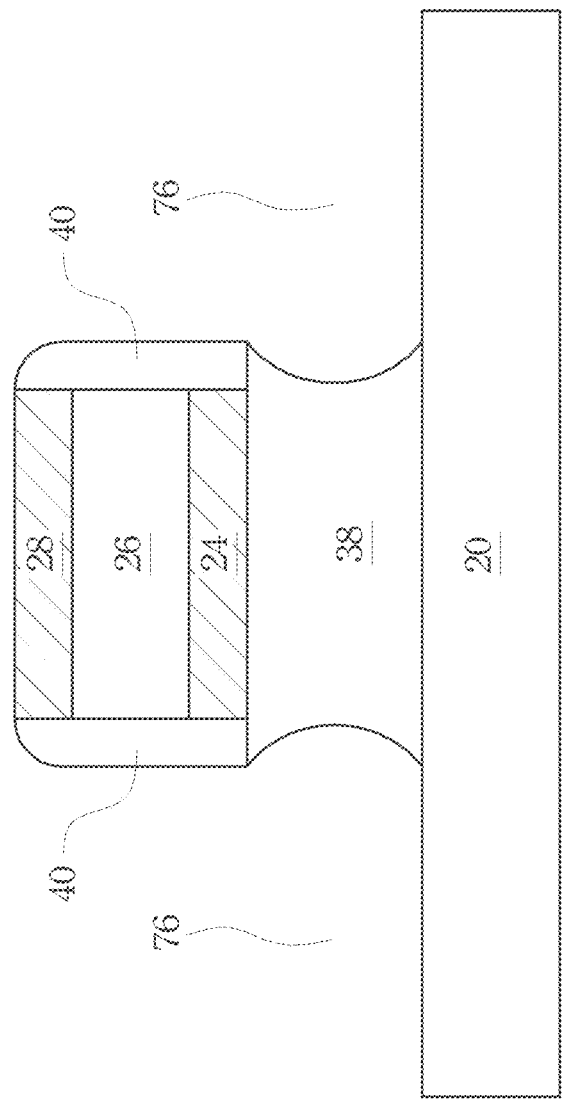
Figure 23:
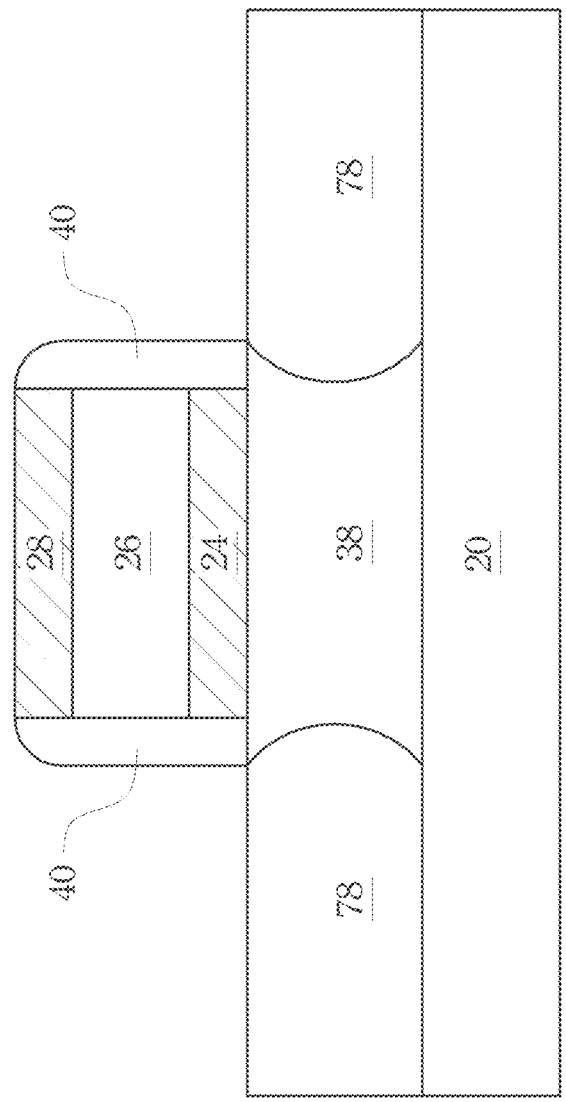

FIGS. 20 through 26 illustrate a third embodiment of the present invention. Referring to FIG. 20, low band-gap layer 22 is formed on substrate 20. A dummy gate stack, including dummy gate dielectric 24, dummy gate electrode 26, and dummy mask 28, is then formed. Next, gate spacers 40 are formed, as is shown in FIG. 21. FIG. 22 illustrates the recessing of low band-gap layer 22, wherein the recessing is preferably isotropic, so that the resulting recesses 76 may extend under gate spacers 40. Alternatively, the recessing is anisotropic. Recesses 76 are then filled with epitaxially grown silicon, forming silicon regions 78, as is shown in FIG. 23.

Figure 24:
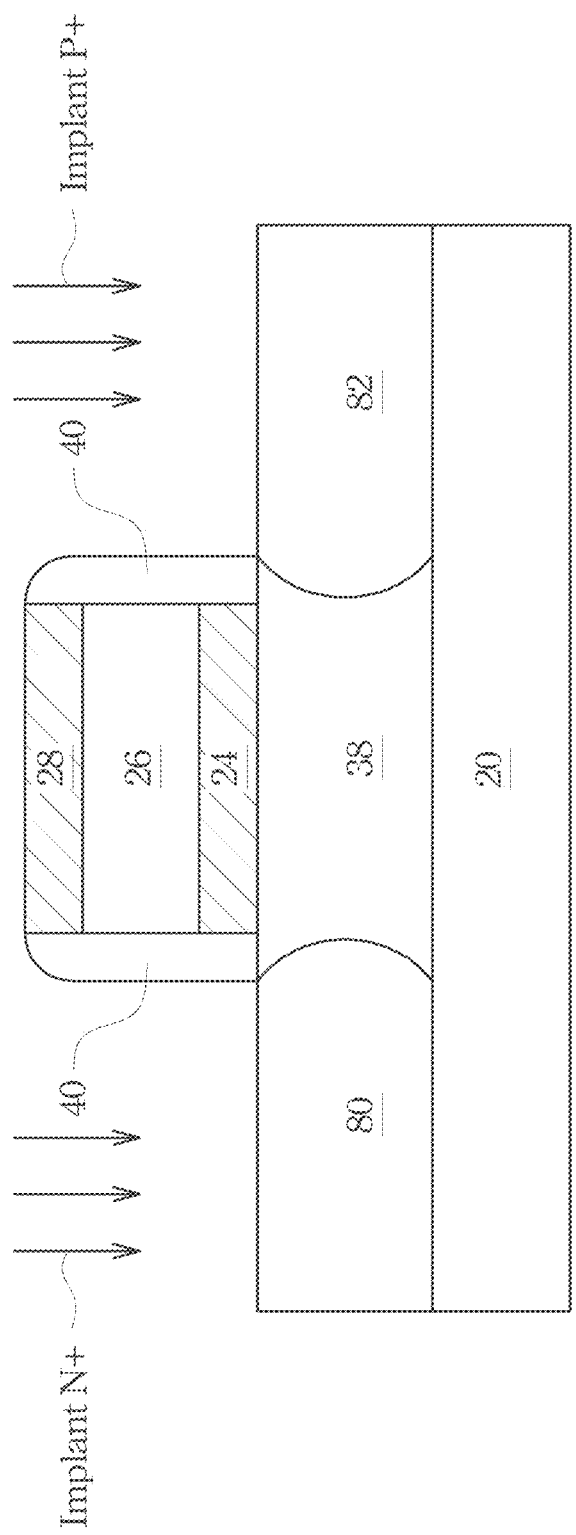

Referring to FIG. 24, n+ drain region 80 and p+ region source 82 are formed. To form n+ drain region 80, a first photo resist (not shown) is formed and patterned, covering a half of the illustrated structure, and an implantation is performed to introduce an n-type impurity, forming n+ drain region 80. The first photo resist is then removed, and a second photo resist is formed to cover the other half of the illustrated structure. An implantation is then performed to introduce a p-type impurity, forming p+ source region 82. The second photo resist is then removed. Preferably, the implantations are substantially vertical.

Figure 25:
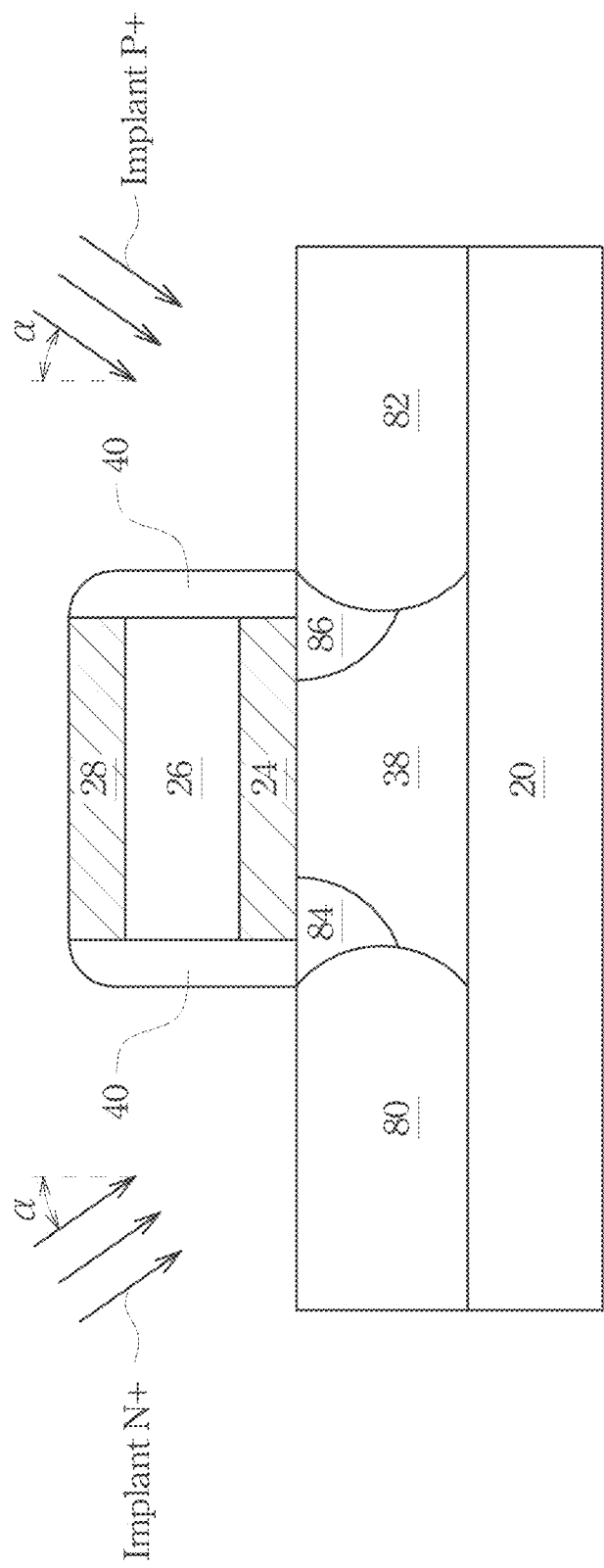

FIG. 25 illustrates the formation of n+ drain extension region 84 and p+ source extension region 86. To form n+ drain extension region 84, a photo resist is formed and patterned. A tilt implantation, which tilts toward the dummy gate stack, is then performed. The implantation energy is preferably less than the energy used for implanting n+ drain region 80. Accordingly, as shown in FIG. 25, the bottoms of n+ drain extension region 84 and p+ source extension region 86 are higher than the bottoms of the respective n+ drain region 80 and p+ region source 82. The photo resist is then removed. Similarly, p+ source extension region 86 is also formed using essentially the same tilt implantation process as n+ drain region 80.

Figure 26:
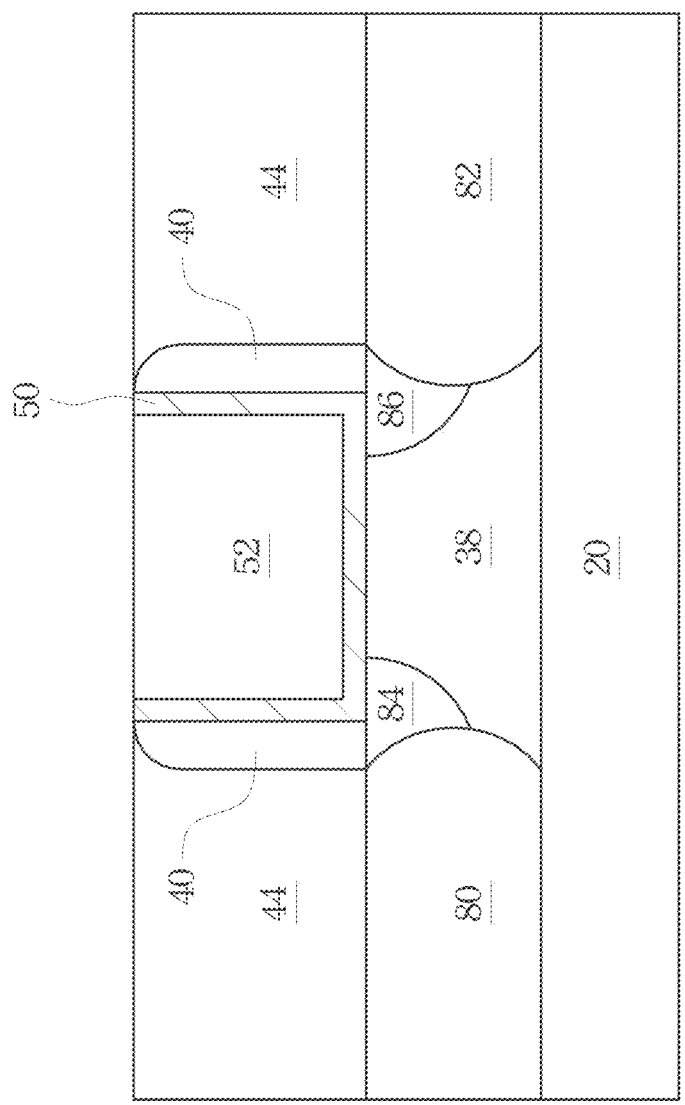

Referring to FIG. 26, ILD 44, gate dielectric 50, and gate electrode 52, which are preferably essentially the same as in the first embodiment, are formed.

Figure 27:
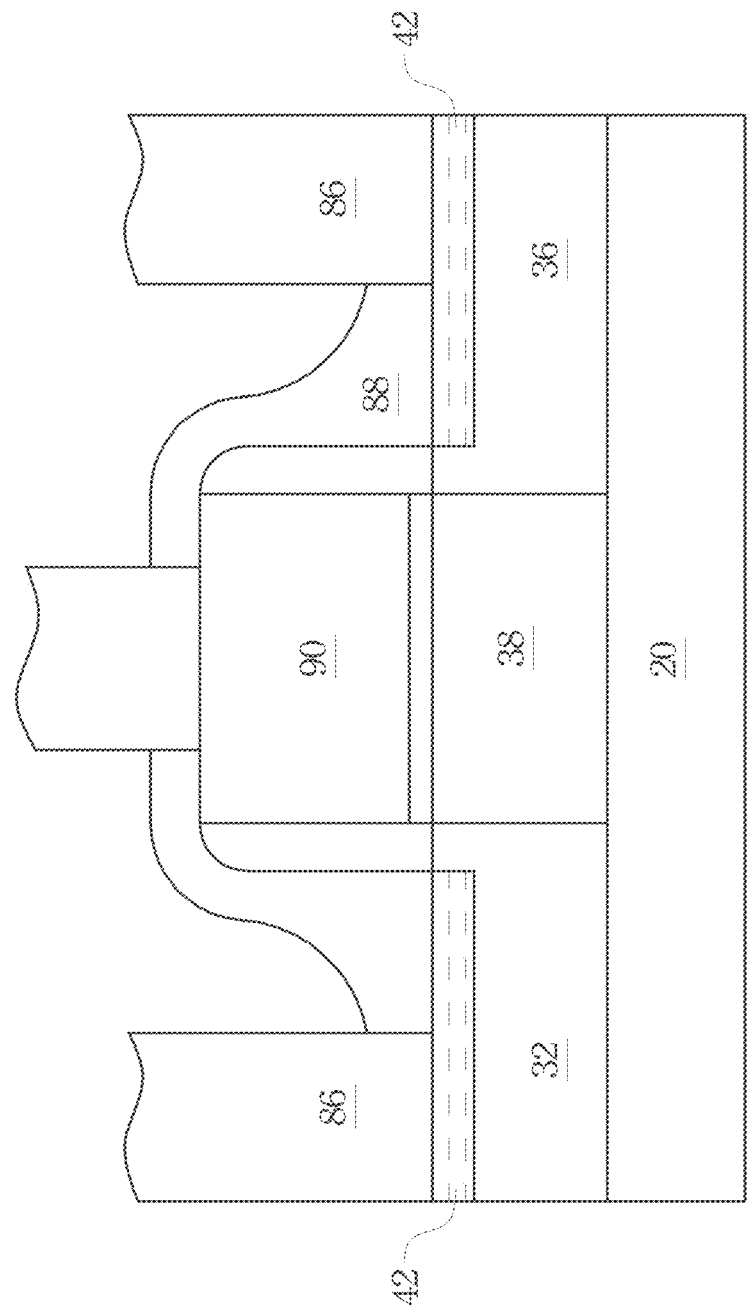
FIG. 27 illustrates an embodiment of the present invention having a gate-first structure, wherein a stressed contact etch stop layer is formed.

In the embodiments discussed in the preceding paragraphs, the left sides of the structures are referred to as the drain sides and the right sides are referred to as source sides. One skilled in the art will realize that the source and drain sides are interchangeable, providing appropriate voltages are applied. In addition, although the first, the second, and the third embodiments use gate-last approaches, wherein the respective gate dielectrics and gate electrodes are formed after the formation of source/drain regions by replacing dummy gate stacks, one skilled in the art will realize that gate-first approach may also be used. FIG. 27 illustrates an exemplary tunnel FET device with a gate-first structure. Contacts 86 are electrically connected to drain region 32 and source region 36. Contact etch stop layer 88 is formed over drain region 32, source region 36, and gate 90. Preferably, for p-channel tunnel FET devices, the respective CESLs provide compressive stresses, while for n-channel tunnel FET devices, the respective CESLs provide tensile stresses.

Figure 1:
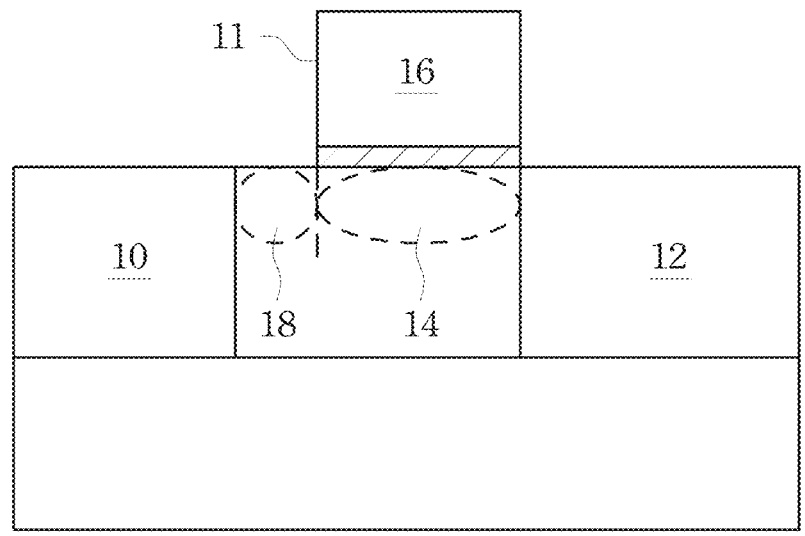
FIG. 1 illustrates an I-MOS device formed of gated p-i-n diode including an offset channel region.
Figure 2:
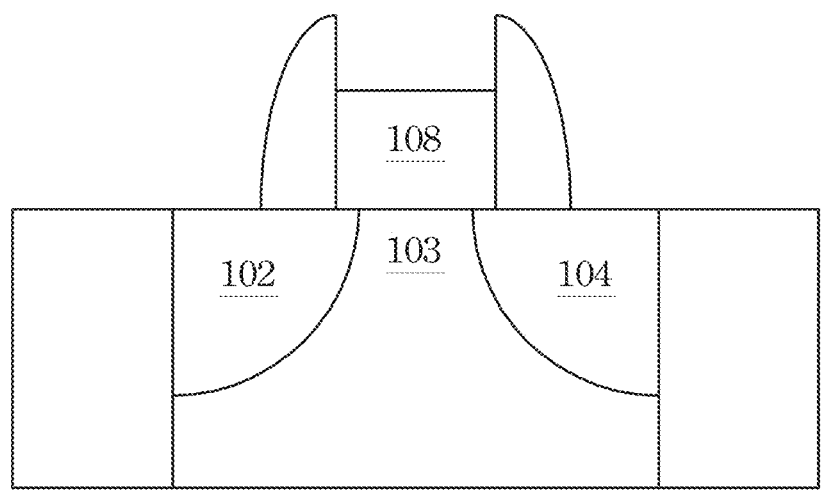
FIG. 2 illustrates a tunnel field-effect transistor (FET), wherein the source region is formed of silicon germanium, the drain region is formed of silicon, and the channel region includes intrinsic silicon.

Simulations have been performed to compare the results of the embodiments of the present invention to conventional MOSFET devices and asymmetric tunnel FET devices, wherein the conventional tunnel FET devices have an asymmetric structure as shown in FIG. 2. The results are shown in Table 3:

TABLE 3

| | Conventional MOSFET | | Conventional Tunnel FET | | Embodiment 1 | | Embodiments 2 and 3 | |
|---|---|---|---|---|---|---|---|---|
| | NFET | PFET | NFET | PFET | NFET | PFET | NFET | PFET |
| Ion | 1 | 0.5 | 1 | 0.01 | 1 | 1 | 1 | 1 |
| Ioff | 1 | 1 | $10^{-6}$ | $10^{-6}$ | $10^{-4}$ | $10^{-4}$ | $10^{-6}$ | $10^{-6}$ |

Wherein the second row indicates the type of the FET devices, the third row shows drive currents of the FET devices, and the fourth row shows the leakage currents. The current values are relative currents (or current ratios) relative to the respective currents of the conventional n-type MOSFETs. The results have shown that the drive currents of the embodiments of the present invention are comparable to conventional MOS devices. However, the leakage currents of the embodiments of the present invention are significantly lower. Compared to the conventional tunnel FET devices, the first embodiment of the present invention has higher p-channel drive currents, although the leakage currents are higher. The n-channel characteristics of the second and the third embodiments of the present invention are comparable to the conventional tunnel FET devices. However, the p-channel characteristics of the second and the third embodiments are significantly better than the conventional p-channel tunnel FET devices.

The embodiments of the present invention have several advantageous features. First, the tunnel FET devices break the conventional MOSFET sub-threshold swing limit, and thus can achieve very high on/off current ratios. Second, the embodiments of the present invention may be applied to both p-channel and n-channel tunnel FET devices without sacrificing either on-currents or off-currents. Third, the current-voltage characteristics have weak temperature dependence and can be used for high-temperature applications. Lastly, the embodiments of the present invention have excellent resistance to short-channel effects and can be used for analog and digital applications with one channel length.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    forming a gate dielectric over a first semiconductor layer, wherein the first semiconductor layer is overlying and contacting a second semiconductor layer, and wherein the first semiconductor layer has a first band-gap smaller than a band-gap of the second semiconductor layer;
    forming a gate electrode over the gate dielectric;
    forming a first source/drain region adjacent the gate dielectric, wherein the first source/drain region is of a first conductive type; and
    forming a second source/drain region adjacent the gate dielectric and on an opposing side of the gate electrode than the first source/drain region, wherein the second source/drain region is of a second conductivity type opposite the first conductivity type.

2. The method of claim 1, wherein the steps of forming the first and the second source/drain regions comprise implanting an n-type impurity and a p-type impurity, respectively, into portions of the first semiconductor layer not masked by the gate electrode.

3. The method of claim 1, wherein the steps of forming the gate dielectric and the gate electrode comprise:
    forming a dummy gate stack;
    forming gate spacers on sidewalls of the dummy gate stack;
    removing the dummy gate stack after the steps of forming the gate spacers and the first and the second source/drain regions;
    forming a gate dielectric layer and a gate electrode layer in a space left by the dummy gate stack; and
    performing a chemical mechanical polish to remove excess portions of the gate dielectric layer and the gate electrode layer, wherein remaining portions of the gate dielectric layer and the gate electrode layer form the gate dielectric and the gate electrode, respectively.

4. The method of claim 1, wherein the first source/drain region is doped heavily to have an impurity concentration higher than about $10^{20}/cm^3$, and the second source/drain region is doped moderately to have an impurity concentration between about $10^{18}/cm^3$ and about $10^{20}/cm^3$.

5. The method of claim 1, wherein the steps of forming the first and the second source/drain regions comprise:
    implanting portions of the first semiconductor layer to form a first and a second source/drain extension region, respectively, wherein portions of the first semiconductor layer on opposite sides of the gate electrode are at least moderately doped with impurities having opposite conductivity types;
    recessing the first semiconductor layer to form recesses;
    filling the recesses with a semiconductor material having a higher band-gap than the first semiconductor layer to form a first and a second semiconductor region; and
    implanting the first and the second semiconductor regions with impurities having opposite conductivity types to foam a first and a second source/drain region, respectively.

6. The method of claim 1, wherein the steps of forming the first and the second source/drain regions comprise:
    recessing the first semiconductor layer to form recesses;
    filling the recesses with a semiconductor material having a higher band-gap than first semiconductor layer to form a first and a second semiconductor region;
    performing a first and a second implantations substantially vertical to implant the first and the second semiconductor regions with impurities of the first and the second conductivity types, respectively; and
    tilt performing a third and a fourth implantation to form a first and a second source/drain extension region adjoining the first and the second semiconductor regions, respectively, wherein the third and the fourth implantations are not vertical to an interface between the gate dielectric and the first semiconductor layer, and wherein the first and the second source/drain extension regions are at least moderately doped and have same conductivity types as the first and the second semiconductor regions, respectively.

7. The method of claim 6, wherein the first and the second implantations are performed with higher energies than the third and the fourth implantations, respectively.

8. The method of claim 6, further comprising epitaxially growing a silicon germanium layer, wherein the first semiconductor layer comprises the silicon germanium layer.

9. A method comprising:
    forming a semiconductor layer over and contacting a semiconductor substrate, wherein the semiconductor layer has a first band-gap smaller than a second band-gap of the semiconductor substrate;
forming a dummy gate stack over the semiconductor layer;
implanting portions of the semiconductor layer unmasked by the dummy gate stack, wherein the portions of the semiconductor layer on opposite sides of the dummy gate stack are at least moderately implanted with impurities having opposite conductivity types;
forming gate spacers on sidewalls of the dummy gate stack after the step of implanting;
using the dummy gate stack and the gate spacer as a mask to recess the semiconductor layer to form recesses;
filling the recesses with a semiconductor material having a higher band-gap than the semiconductor layer to form a first and a second semiconductor region;
implanting the first and the second semiconductor regions with impurities having opposite conductivity types;
removing the dummy gate stack;
forming a gate dielectric layer and a gate electrode layer in a space left by the dummy gate stack; and
performing a chemical mechanical polish, wherein remaining portions of the gate dielectric layer and the gate electrode layer form a gate dielectric and a gate electrode, respectively.

10. The method of claim 9, wherein the step of recessing comprises plasma etching.

11. The method of claim 9, wherein the step of recessing comprises:
implanting amorphizing species into exposed portions of the semiconductor layer to form amorphized regions; and
selectively etching the amorphized regions.

12. The method of claim 9, wherein the step of removing the dummy gate stack comprises:
forming an inter-layer dielectric (ILD);
planarizing a top surface of the ILD to level with a top surface of the dummy gate stack; and
etching the dummy gate stack.

13. The method of claim 9, wherein the step of forming the semiconductor layer comprises epitaxially growing the semiconductor layer having a band-gap lower than a band-gap of silicon.

14. A method comprising:
forming a semiconductor layer over and contacting a semiconductor substrate, wherein the semiconductor layer has a first band-gap smaller than a second band-gap of the semiconductor substrate;
forming a dummy gate stack over the semiconductor layer;
forming gate spacers on sidewalls of the dummy gate stack;
using the dummy gate stack and the gate spacers as a mask to recess the semiconductor layer to form recesses;
filling the recesses with a semiconductor material having a higher band-gap than the semiconductor layer to form a first and a second semiconductor region;
performing a first and a second implantation substantially vertically to implant the first and the second semiconductor regions with impurities having opposite conductivity types, wherein a first source/drain region and a second source/drain region are formed;
tilt performing a third and a fourth implantation to form a first and a second source/drain extension region adjoining the first and the second semiconductor regions, respectively, wherein the third and the fourth implantations are not vertical to an interface between the semiconductor layer and the semiconductor substrate, and wherein the first and the second source/drain extension regions are at least moderately doped and have same conductivity types as the first and the second semiconductor regions, respectively;
removing the dummy gate stack;
forming a gate dielectric layer and a gate electrode layer in a space left by the dummy gate stack; and
performing a chemical mechanical polish, wherein remaining portions of the gate dielectric layer and the gate electrode layer form a gate dielectric and a gate electrode, respectively.

15. The method of claim 14, wherein the first and the second implantations are performed with higher energies than the third and the fourth implantations, respectively.

16. The method of claim 15, wherein the first and the second source/drain extension regions have depths smaller than depths of the respective first and the second source/drain regions.

17. The method of claim 14, wherein the step of recessing comprises plasma etching.

18. The method of claim 14, wherein the step of recessing comprises an isotropic etching.

19. The method of claim 14, wherein the step of recessing comprises:
implanting amorphizing species into exposed portions of the semiconductor layer to form amorphized regions; and
selectively etching the amorphized regions.

20. The method of claim 14, wherein the step of removing the dummy gate stack comprises:
forming an inter-layer dielectric (ILD);
planarizing a top surface of the ILD to level with a top surface of the dummy gate stack; and
etching the dummy gate stack.

* * * * *

UNITED STATES PATENT AND TRADEMARK OFFICE
CERTIFICATE OF CORRECTION

| | | |
|---|---|---|
| PATENT NO. | : 8,697,510 B2 | Page 1 of 1 |
| APPLICATION NO. | : 13/741086 | |
| DATED | : April 15, 2014 | |
| INVENTOR(S) | : Krishna Kumar Bhuwalka | |

It is certified that error appears in the above-identified patent and that said Letters Patent is hereby corrected as shown below:

In the Claims

In Col. 12, line 37, claim 5, delete "foam" and insert --form--

Signed and Sealed this
Twenty-ninth Day of July, 2014

Michelle K. Lee
*Deputy Director of the United States Patent and Trademark Office*